United States Patent
Chinthakindi et al.

(10) Patent No.: US 8,435,864 B2
(45) Date of Patent: May 7, 2013

(54) PROCESS FOR SINGLE AND MULTIPLE LEVEL METAL-INSULATOR-METAL INTEGRATION WITH A SINGLE MASK

(75) Inventors: Anil K. Chinthakindi, Poughkeepsie, NY (US); Douglas D. Coolbaugh, Essex Junction, VT (US); Keith E. Downes, Stowe, VT (US); Ebenezer E. Eshun, Essex Junction, VT (US); Zhong-Xiang He, Essex Junction, VT (US); Robert M. Rassel, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/432,440

(22) Filed: Mar. 28, 2012

(65) Prior Publication Data

US 2012/0184081 A1    Jul. 19, 2012

Related U.S. Application Data

(62) Division of application No. 11/162,661, filed on Sep. 19, 2005, now Pat. No. 8,207,568.

(51) Int. Cl.
*H01L 21/28* (2006.01)
(52) U.S. Cl.
USPC .... 438/393; 438/381; 438/396; 257/E21.008; 257/532

(58) Field of Classification Search ............... 438/381, 438/393, 396, 397; 257/528, 532, E21.008
See application file for complete search history.

(56) References Cited

U.S. PATENT DOCUMENTS

| | | |
|---|---|---|
| 5,079,177 A | 1/1992 | Lage et al. |
| 5,234,541 A | 8/1993 | Shannon et al. |
| 5,812,364 A | 9/1998 | Oku et al. |
| 6,452,779 B1 | 9/2002 | Adler et al. |
| 6,472,124 B1 | 10/2002 | Chung |
| 6,750,114 B2 | 6/2004 | Adler et al. |
| 6,777,777 B1 | 8/2004 | Kar-Roy et al. |
| 6,803,641 B2 | 10/2004 | Rao et al. |
| 6,982,444 B2 | 1/2006 | Kanaya et al. |
| 2002/0123008 A1 | 9/2002 | Ning |
| 2004/0124496 A1 | 7/2004 | Rao et al. |
| 2005/0006687 A1 | 1/2005 | Dirnecker et al. |

*Primary Examiner* — Kenneth Parker
*Assistant Examiner* — John Lin
(74) *Attorney, Agent, or Firm* — Anthony Canale; Roberts Mlotkowski Safran & Cole, P.C.

(57) ABSTRACT

A method of fabricating a MIM capacitor is provided. The method includes providing a substrate including a dielectric layer formed on a first conductive layer and a second conductive layer formed over the dielectric layer, and patterning a mask on the second conductive layer. Exposed portions of the second conductive layer are removed to form an upper plate of a MIM capacitor having edges substantially aligned with respective edges of the mask. The upper plate is undercut so that edges of the upper plate are located under the mask. Exposed portions of the dielectric layer and the first conductive layer are removed using the mask to form a capacitor dielectric layer and a lower plate of the MIM capacitor having edges substantially aligned with respective edges of the mask.

19 Claims, 27 Drawing Sheets

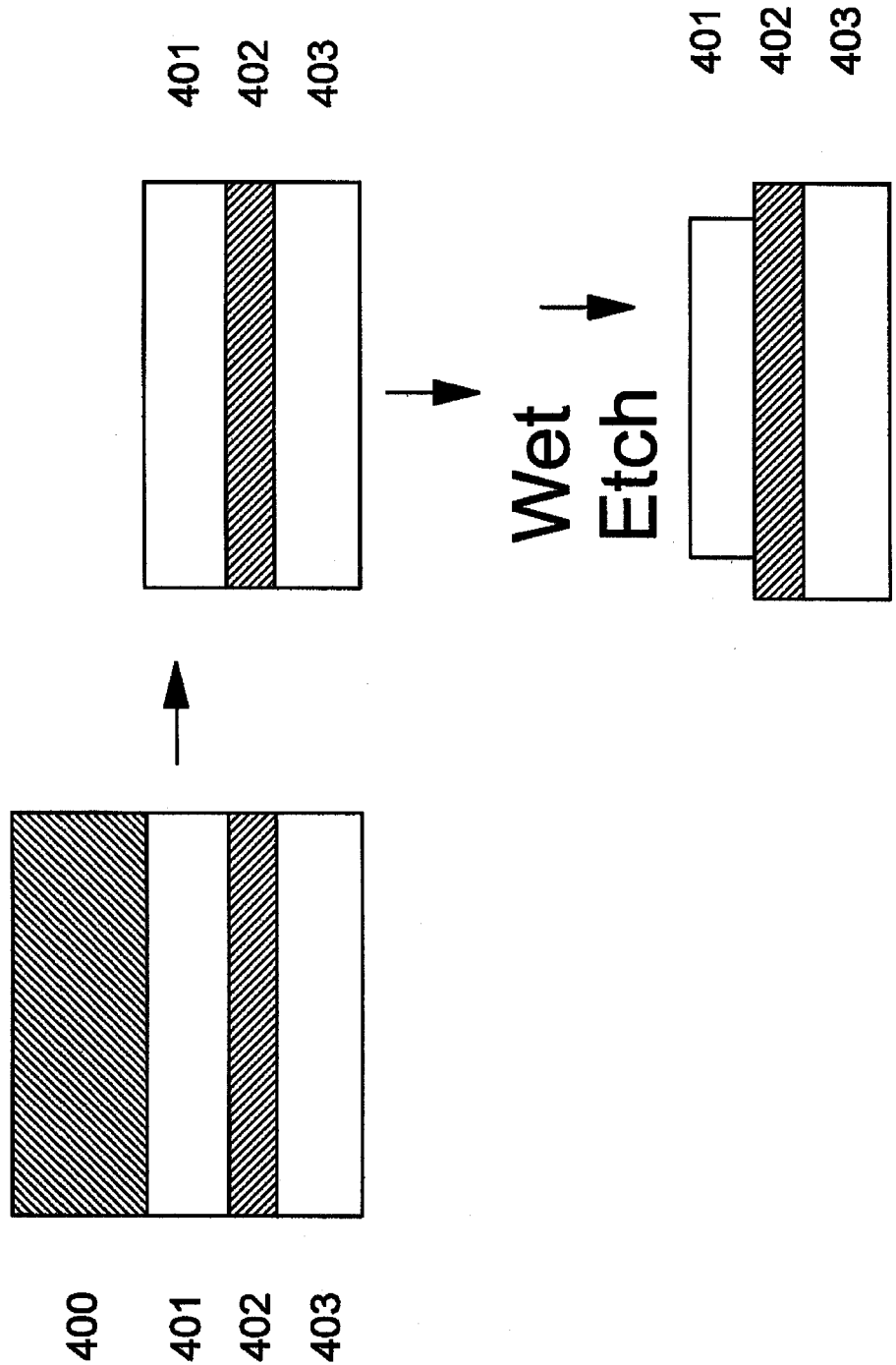

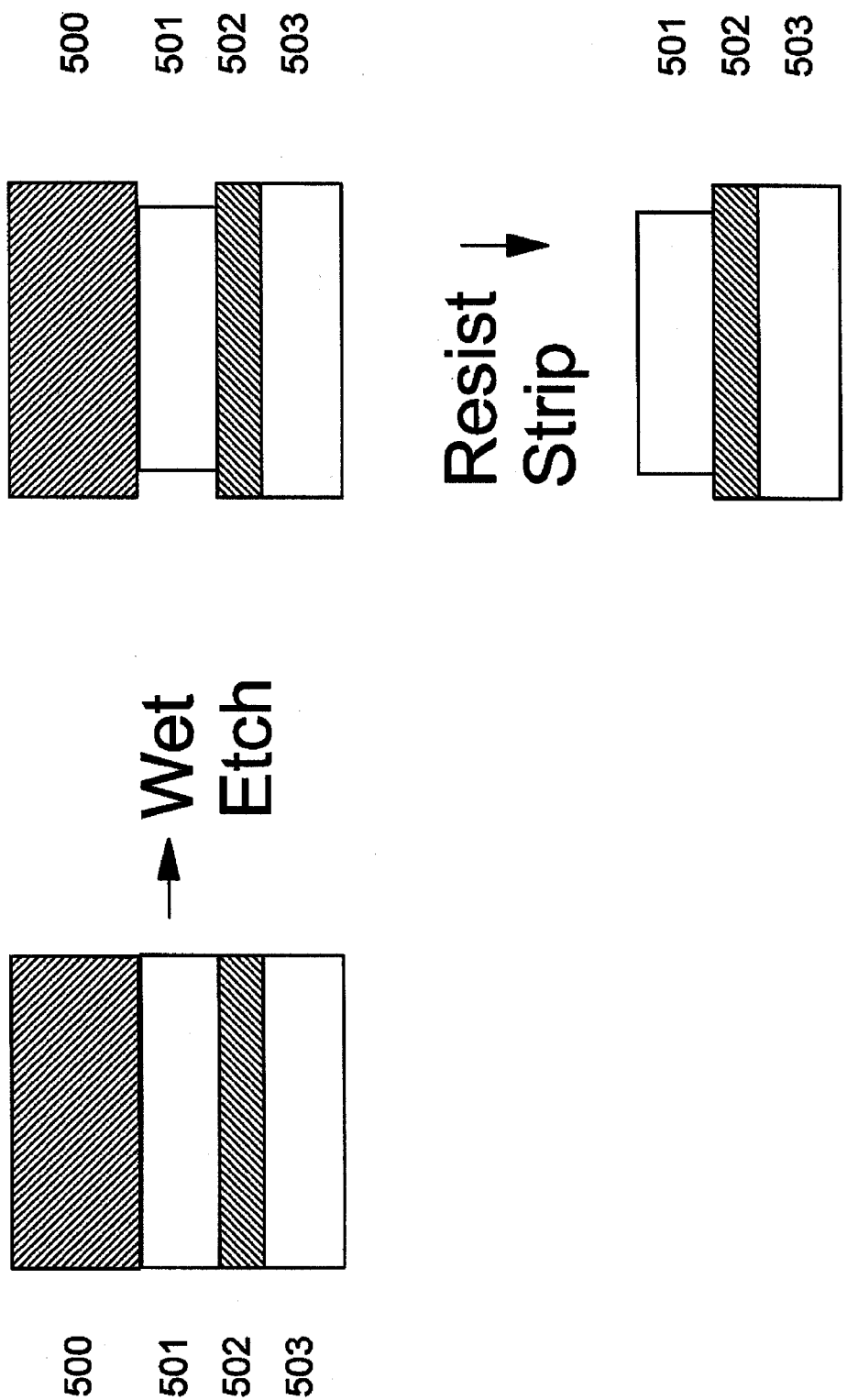

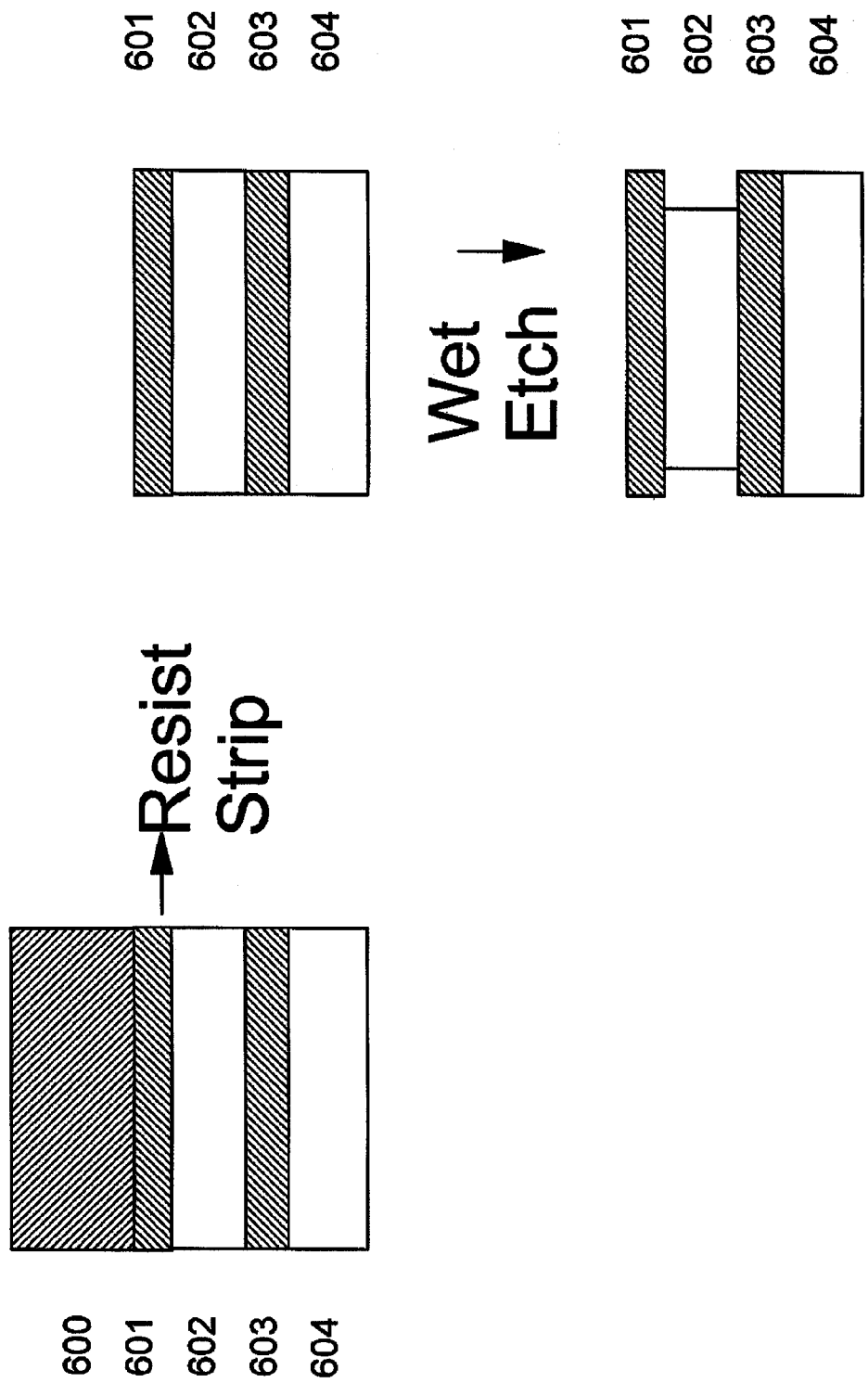

US 8,435,864 B2

PROCESS FOR SINGLE AND MULTIPLE LEVEL METAL-INSULATOR-METAL INTEGRATION WITH A SINGLE MASK

CROSS-REFERENCE TO RELATED APPLICATIONS

The present application is a divisional application of U.S. application Ser. No. 11/162,661, filed on Sep. 19, 2005, the contents of which are herein incorporated by reference in its entirety.

FIELD OF THE INVENTION

The present invention relates to a single and multiple level metal-insulator-metal (MIM) integration.

BACKGROUND DESCRIPTION

According to the known art, MIM integration utilizes a separate mask to define each MIM plate, i.e., two (2) masks for a single MIM and three (3) masks for a dual MIM in all Cu BEOL Integration. For the aluminum MIM version, the bottom plate is formed of the same material as the wiring level so that an extra mask is needed only for the top plate in single MIM or for the top and middle plates in dual MIM.

For higher capacitance, more mask levels are required, which makes the MIM more expensive. After HiK, super high capacitance MIMs will only be possible with more MIM levels. Thus, there is a need for cheaper integration in order to increase MIM levels without adding further masking levels.

A conventional process for dual MIM integration is shown in FIGS. 1-5. A capacitor 100 to be formed is shown having a conductive top plate 101, e.g., titanium nitride (TiN), a first dielectric layer 102, e.g., silicon dioxide (SiO$_2$), SiN, Hi-K materials, a conductive second plate 103, e.g., TiN, a second dielectric layer 104, e.g., SiO$_2$, SiN, Hi-K materials, and a conductive bottom plate 105. Bottom plate 105, which may be a sandwiched conductor of more than one metal, e.g., titanium nitride/tungsten/titanium nitride (TiN/W/TiN), is formed on an insulating layer 106, e.g., SiO$_2$, acting as an etch stop layer, which is formed on insulating layer 107, e.g., silicon nitride, acting as a diffusion barrier from conductors 108, e.g., copper.

In a second step, depicted in FIG. 2, in the formation of capacitor 100, a resist 110, formed of a resist material suitable for the etching to be performed, is placed over top plate 101. Portions of plate 101 lying outside of mask 101 are removed, e.g., via etching, to first dielectric layer 102. In a third step in the process, shown in FIG. 3, a second mask 120, is placed over upper layer 101, i.e., to envelop the entire layer, and onto first dielectric layer 102 to define the geometry of second plate 103. The portions of first dielectric layer 102 and second plate 103 outside of mask 120 are removed to second dielectric layer 104. In a fourth step in the process, shown in FIG. 4, a third mask 130 is placed over upper layer 101, first dielectric layer 102, and second layer 103, i.e., to envelop the entireties of these layers, and onto second dielectric layer 104 to define the geometry of bottom plate 105. The portions of second dielectric layer 104 and bottom plate 105 outside of mask 130 are removed to etch stop layer 106. In the fifth step shown in FIG. 5, the dual MIM parallel wiring is coupled from conductor 112 to capacitor 100 through vias 114, 115, 116, and 117, e.g., copper, and from conductor 113 to capacitor 100 through via 118, e.g., copper.

SUMMARY OF THE INVENTION

The present invention is directed to a method of fabricating a MIM capacitor. The method includes providing a substrate including a dielectric layer formed on a first conductive layer and a second conductive layer formed over the dielectric layer, and patterning a mask on the second conductive layer. Exposed portions of the second conductive layer are removed to form an upper plate of a MIM capacitor having edges substantially aligned with respective edges of the mask. The upper plate is undercut so that edges of the upper plate are located under the mask. Exposed portions of the dielectric layer and the first conductive layer are removed using the mask to form a capacitor dielectric layer and a lower plate of the MIM capacitor having edges substantially aligned with respective edges of the mask.

The invention is directed to a method of fabricating an MIM capacitor from a substrate having a first conductive layer and a second conductive layer separated by a first dielectric layer. The method includes placing a mask on the first conductive layer, removing exposed portions of the first conductive layer outside of the mask, such that a periphery of the first conductive layer essentially aligns with a periphery of the mask, and pulling back the periphery of the first conductive layer, such that the periphery of the first conductive layer is located under the mask. The method further includes removing exposed portions of the first dielectric layer and the second conductive layer outside of the mask, such that a periphery of the first dielectric layer and the second conductive layer essentially align with the periphery of the mask.

The invention is directed to a MIM capacitor having a plurality of conductive layers having peripheries that increase from a top plate to a bottom plate, and a plurality of dielectric layers having a same periphery that corresponds to the periphery of said bottom plate.

BRIEF DESCRIPTION OF THE DRAWINGS

FIG. 25 illustrates an embodiment in which a resist layer is stripped prior to wet etching;

FIG. 26 illustrates an embodiment in which wet etching is performed prior to stripping a resist layer; and FIG. 27 illustrates an embodiment in which a resist layer is stripped from a dielectric layer prior to wet etching the layer below the dielectric layer.

DETAILED DESCRIPTION OF EMBODIMENTS OF THE PRESENT INVENTION

The invention relates to a method of forming a metal-insulator-metal (MIM) capacitor using a single masking step. In accordance with the invention, layers of upper metal/dielectric/lower metal are formed over a substrate, and a masking layer is formed over the upper metal and the layers are patterned. Portions of the upper metal are removed (i.e., by wet or dry etch) selective to the dielectric to form the upper capacitor plate. According to the invention, an integration scheme allows multiple MIM level integration with a single mask. In particular, integration of the MIM is achieved through a combination of hardmask and plasma etches.

Figure 1:
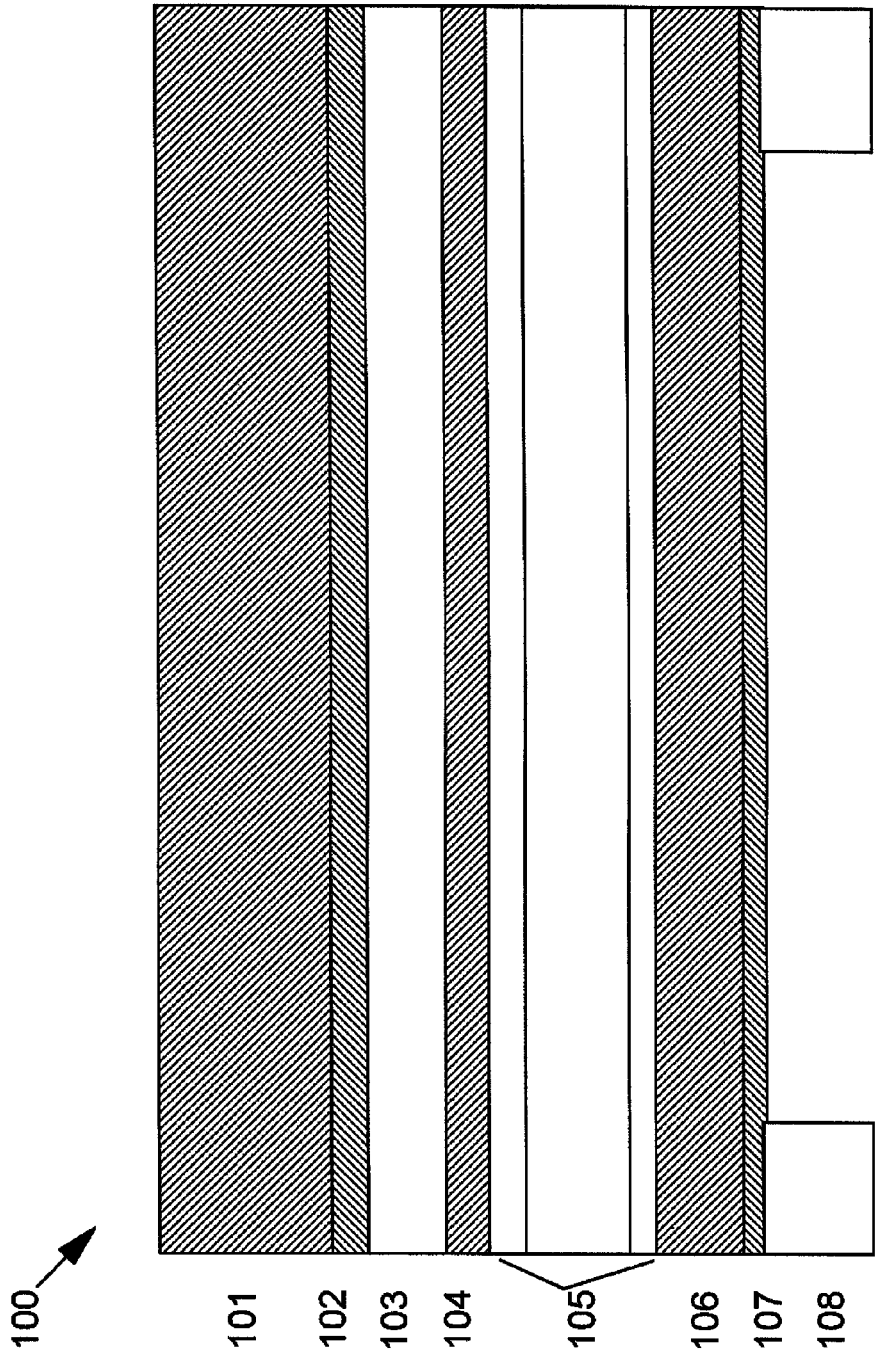
FIGS. 1-5 illustrate a conventional dual MIM integration.
Figure 2:
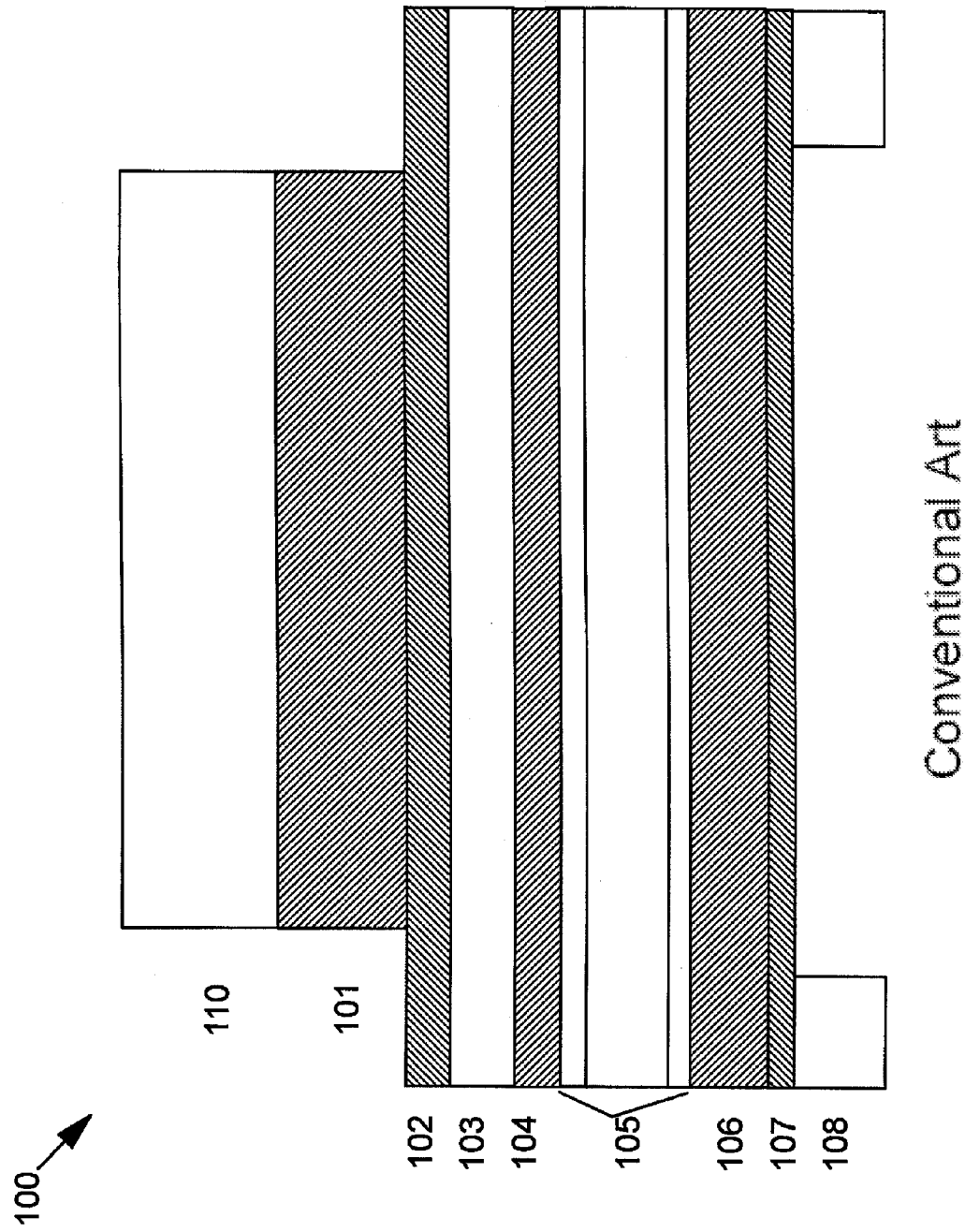
Figure 3:
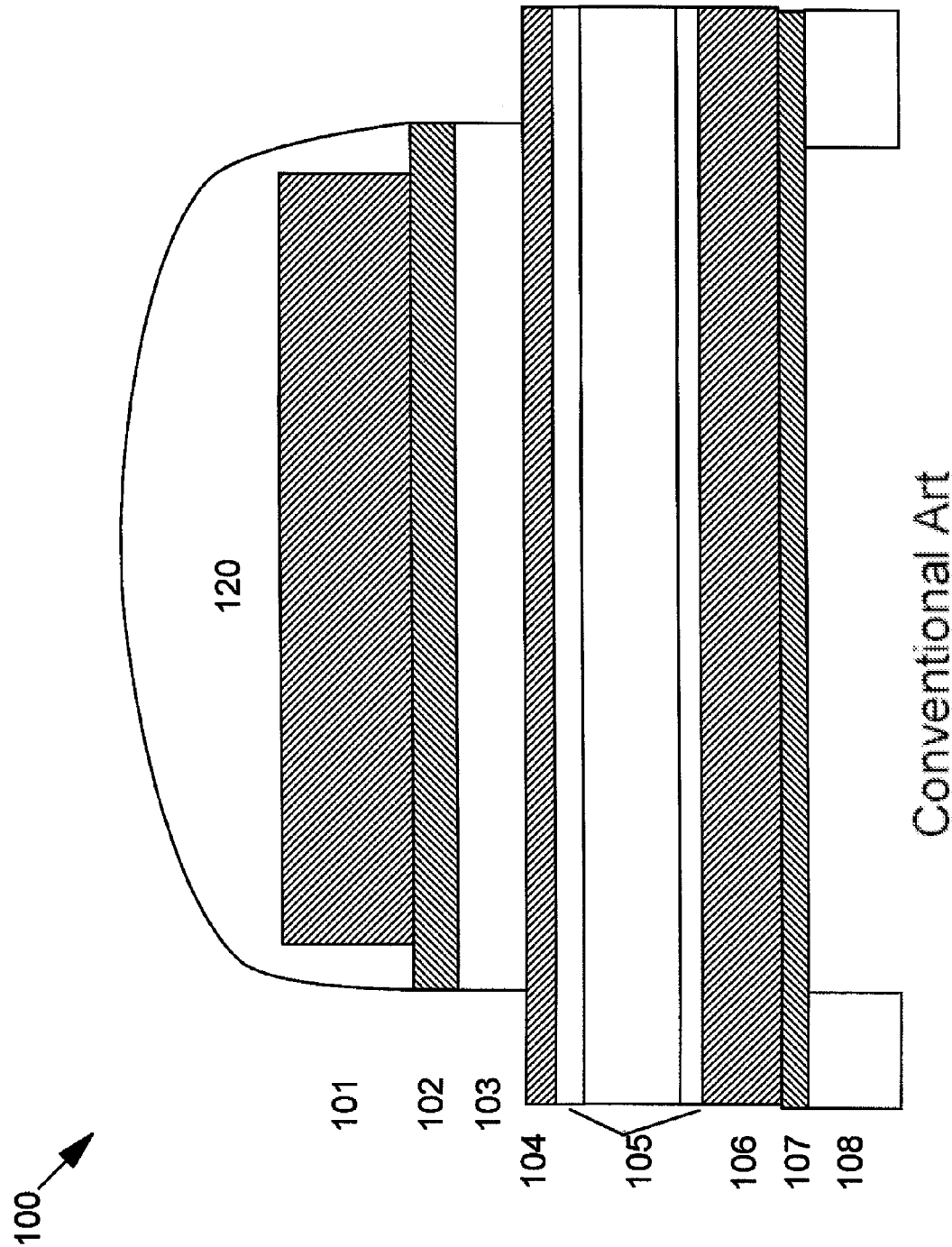
Figure 4:
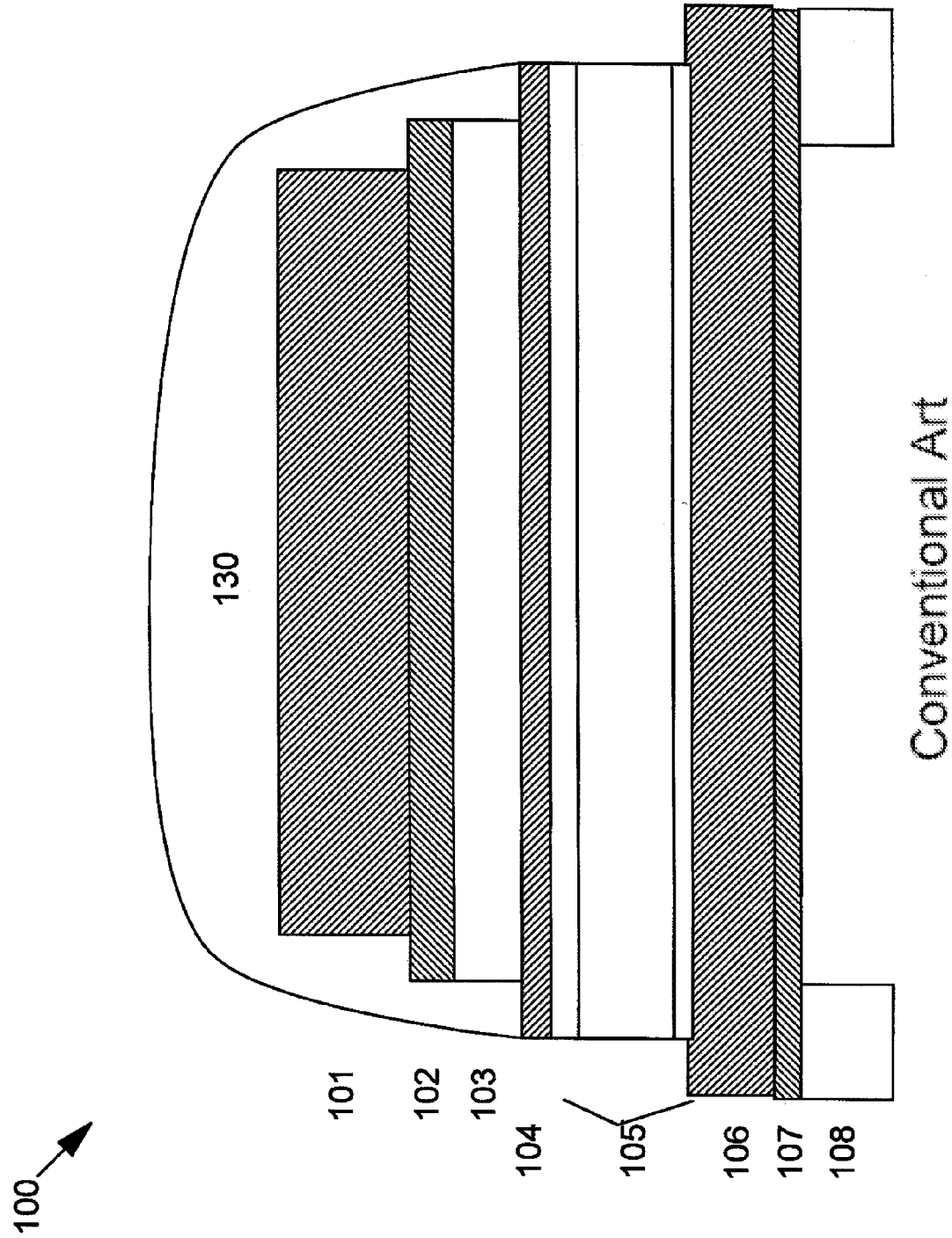
Figure 5:
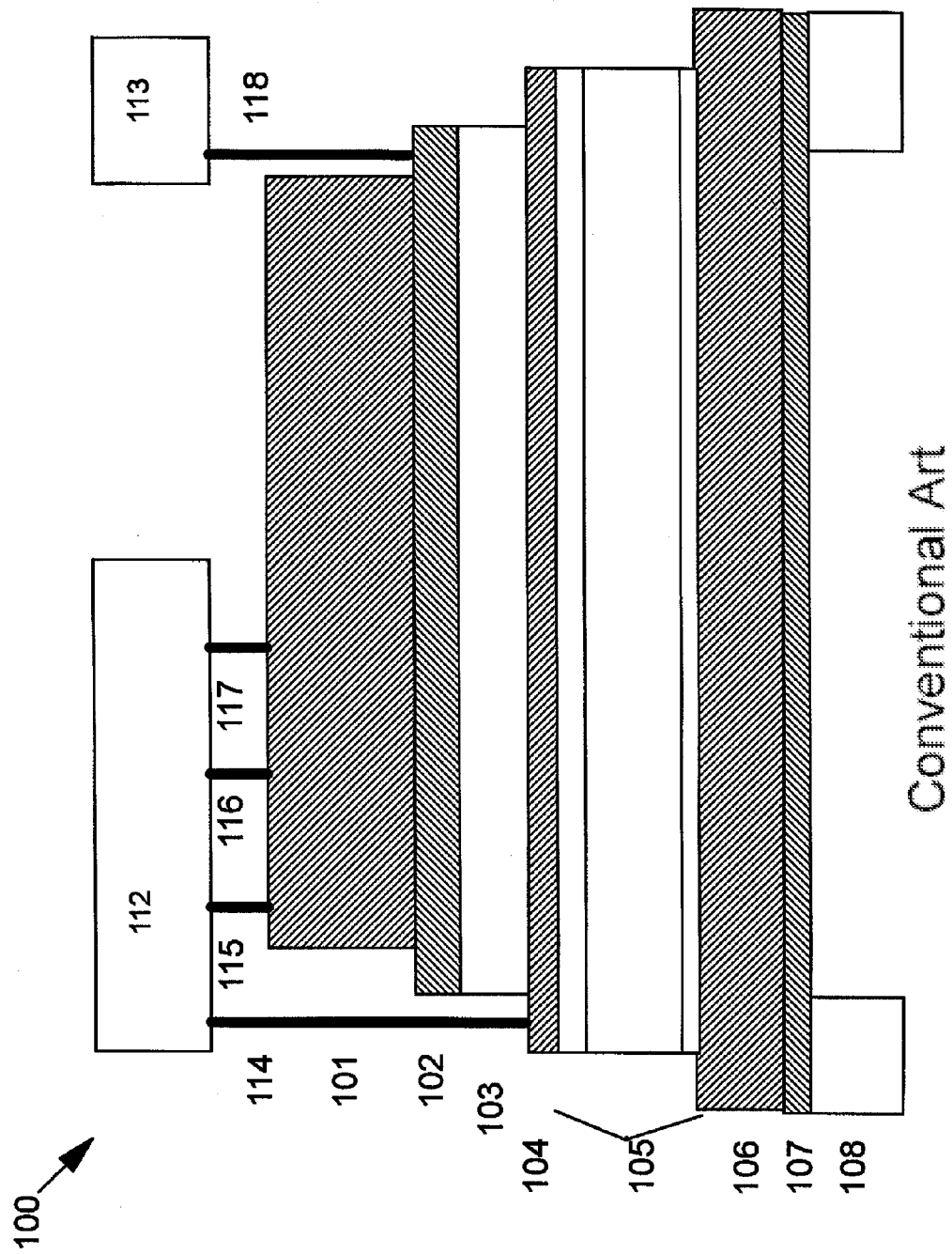
Figure 6:
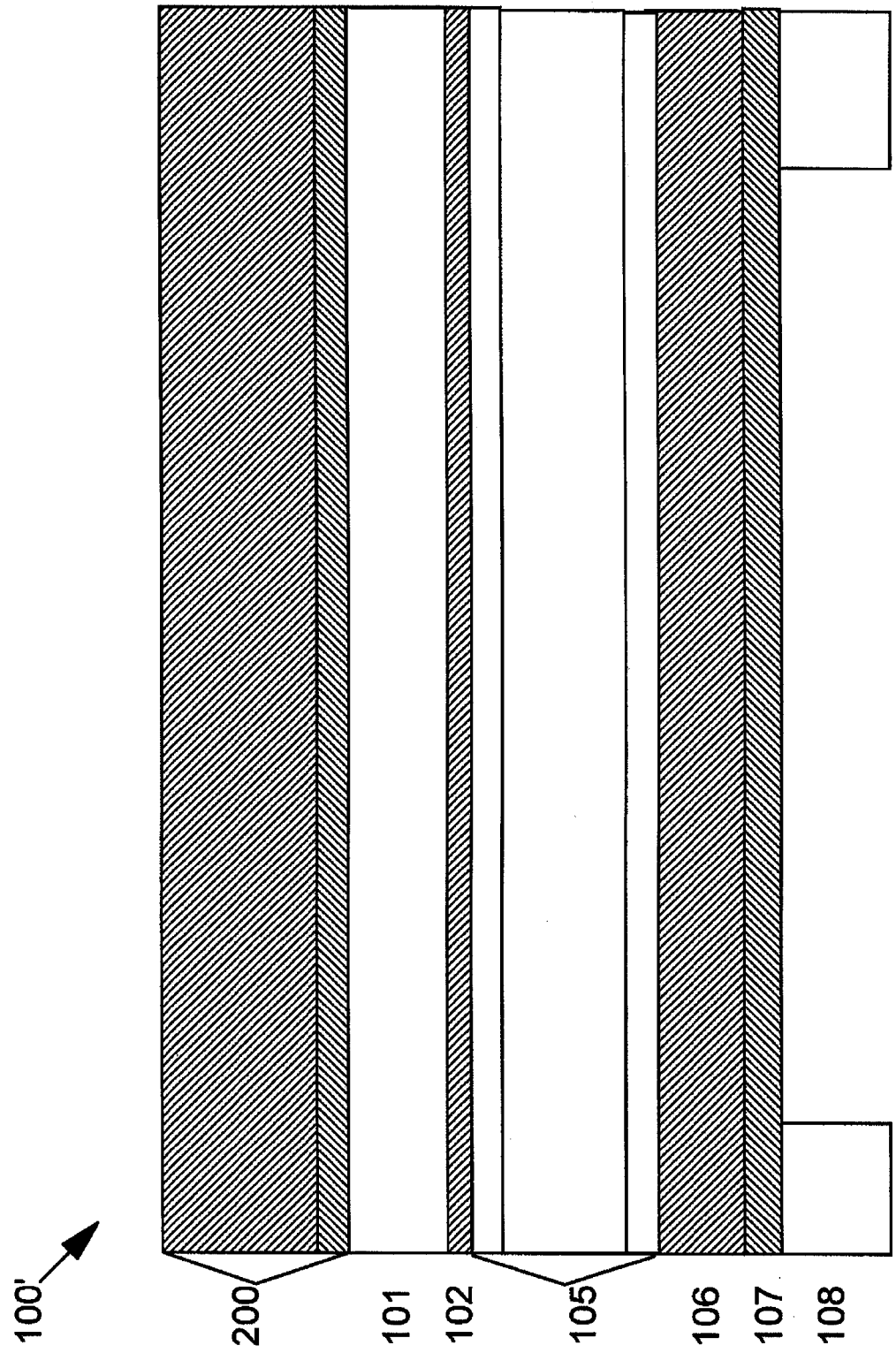
FIGS. 6-11 illustrate a single MIM integration in accordance with the features of the present invention.

In contrast to conventional processes, which utilized a number of masks even for single MIM integration, the present invention utilizes only a single mask even for multiple MIM integration. An exemplary embodiment of the instant invention directed to single MIM integration is shown in FIGS. 6-11. The process begins with the formation of the substrate through blanket film deposition, as shown in FIG. 6. In particular, a hard mask 200, which may be a single insulator or a sandwiched insulator composed of more than one element, e.g., $SiO_2$/SiN is positioned over a conductive top layer 101, e.g., TiN, TaN, tungsten, aluminum, or any other suitable conductor, which is provided over bottom conductive layer 105, which may be a single conductor or a sandwiched conductor formed of more than one metal, e.g., TiN/W/TiN, Ta/TaN, or any suitable conductor, and first dielectric layer 102, e.g., $SiO_2$, SiN, Hi-K materials, aluminum oxide, tantalum oxide, hafnium oxide, zirconium oxide, or other suitable dielectric. As in the conventional processes, bottom plate 105 is formed on an insulating layer 106, e.g., $SiO_2$ or any suitable insulator, acting as an etch stop layer, which is formed on insulating layer 107, e.g., silicon nitride or other suitable insulator, acting as a diffusion barrier with conductors 108, e.g., copper or other suitable conductor.

Figure 7:
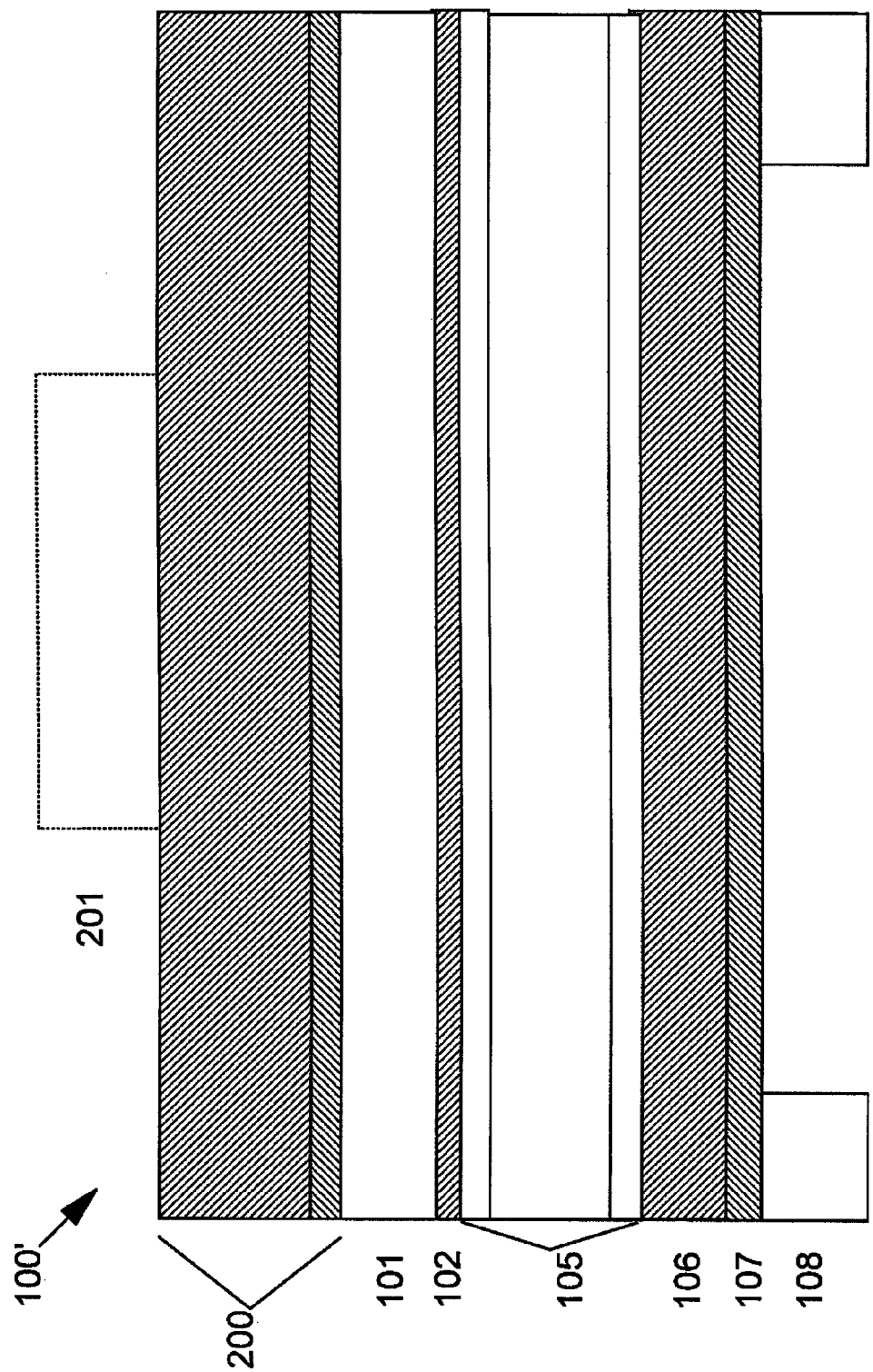
Figure 8:
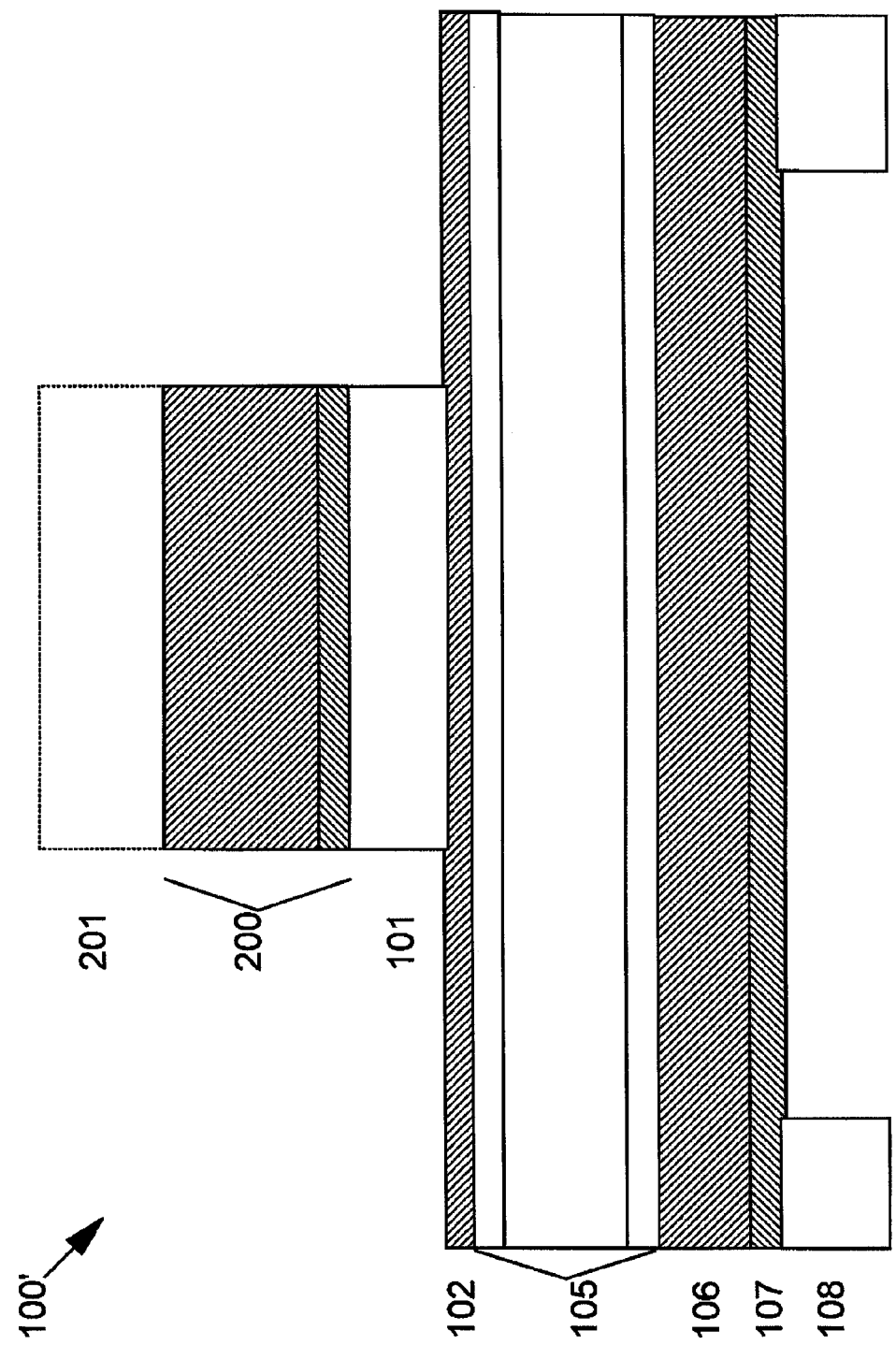
Figure 9:
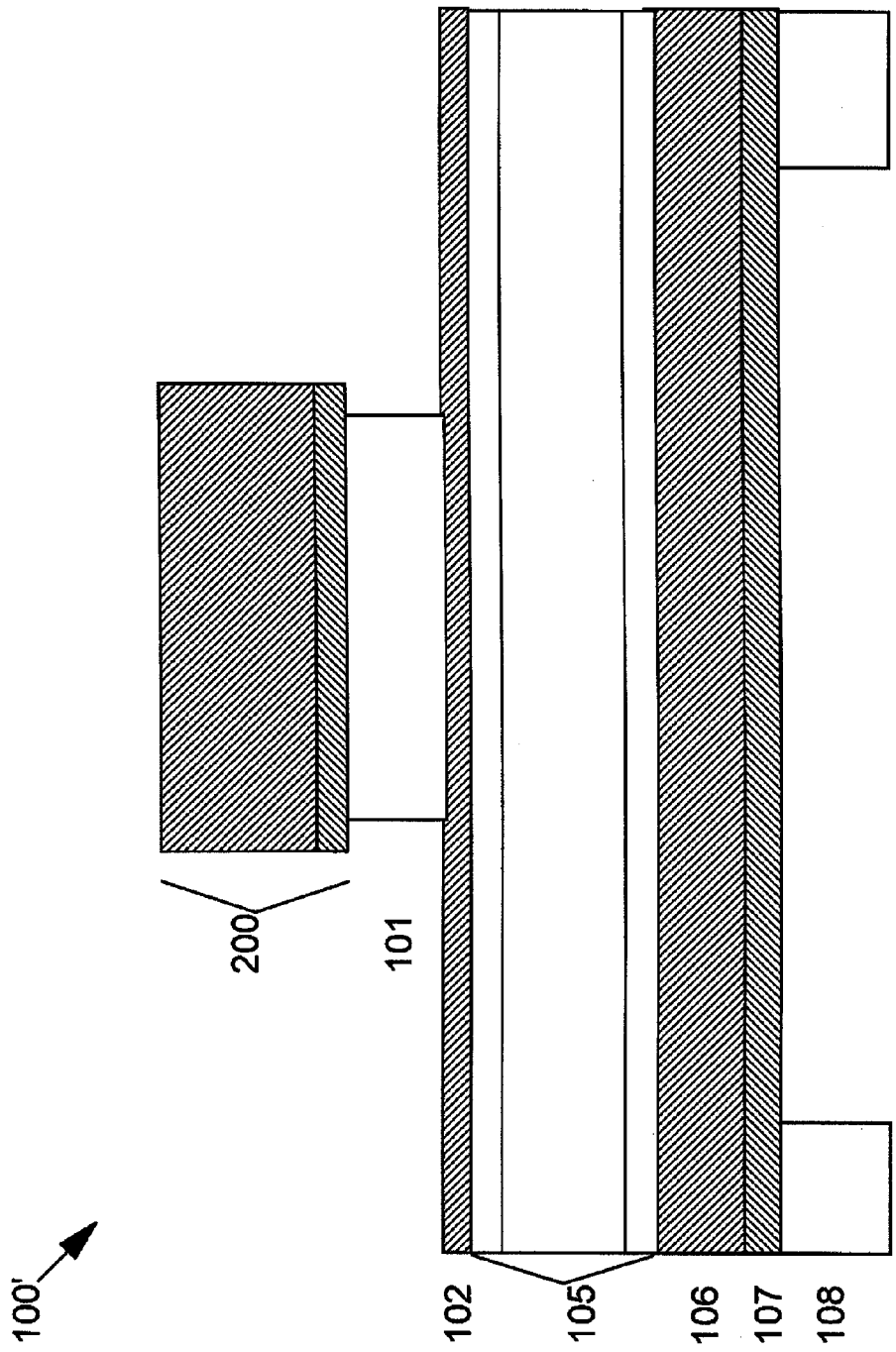
Figure 12:
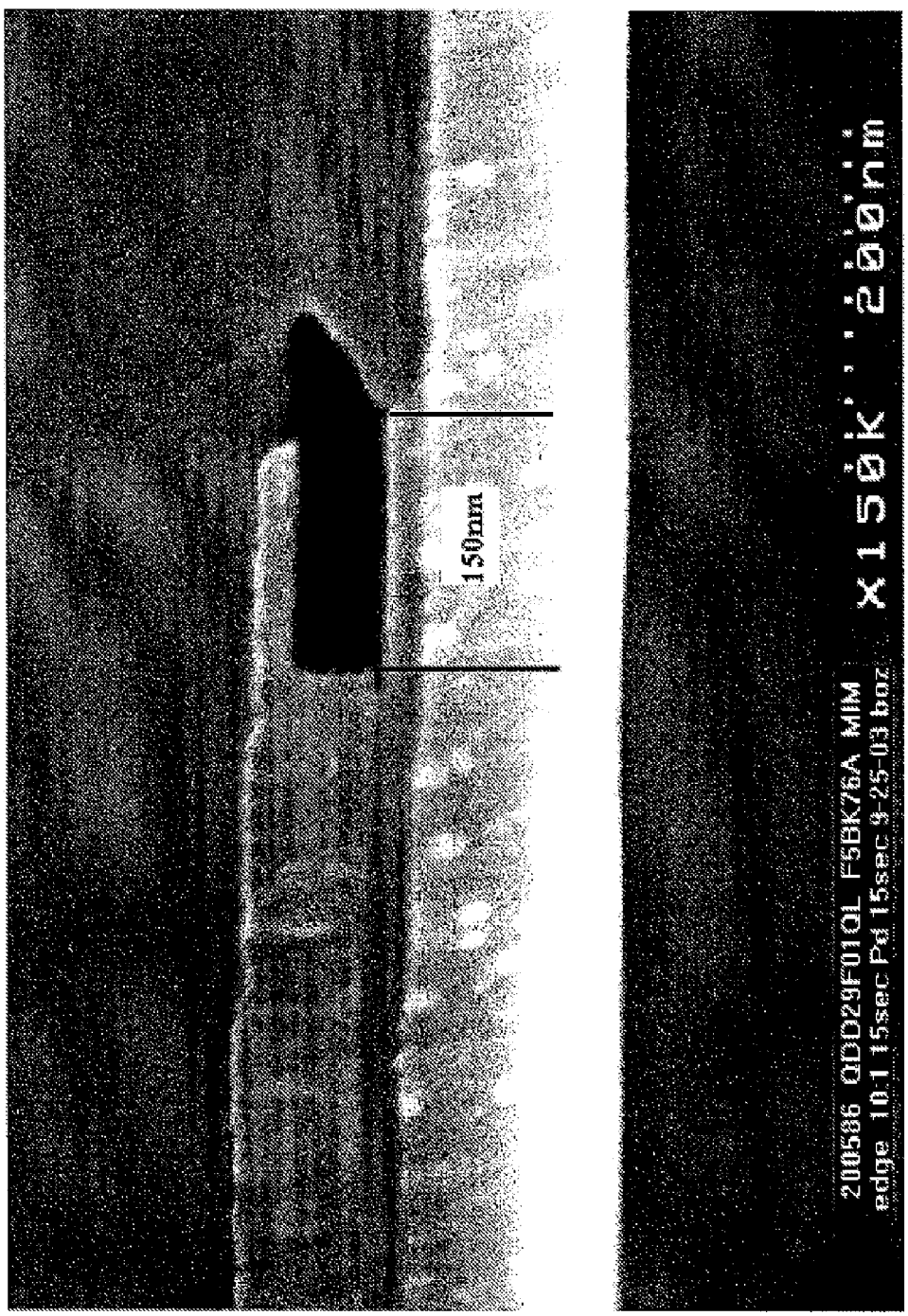
FIG. 12 illustrates the pull back of the exposed layer below its dielectric.
Figure 13:
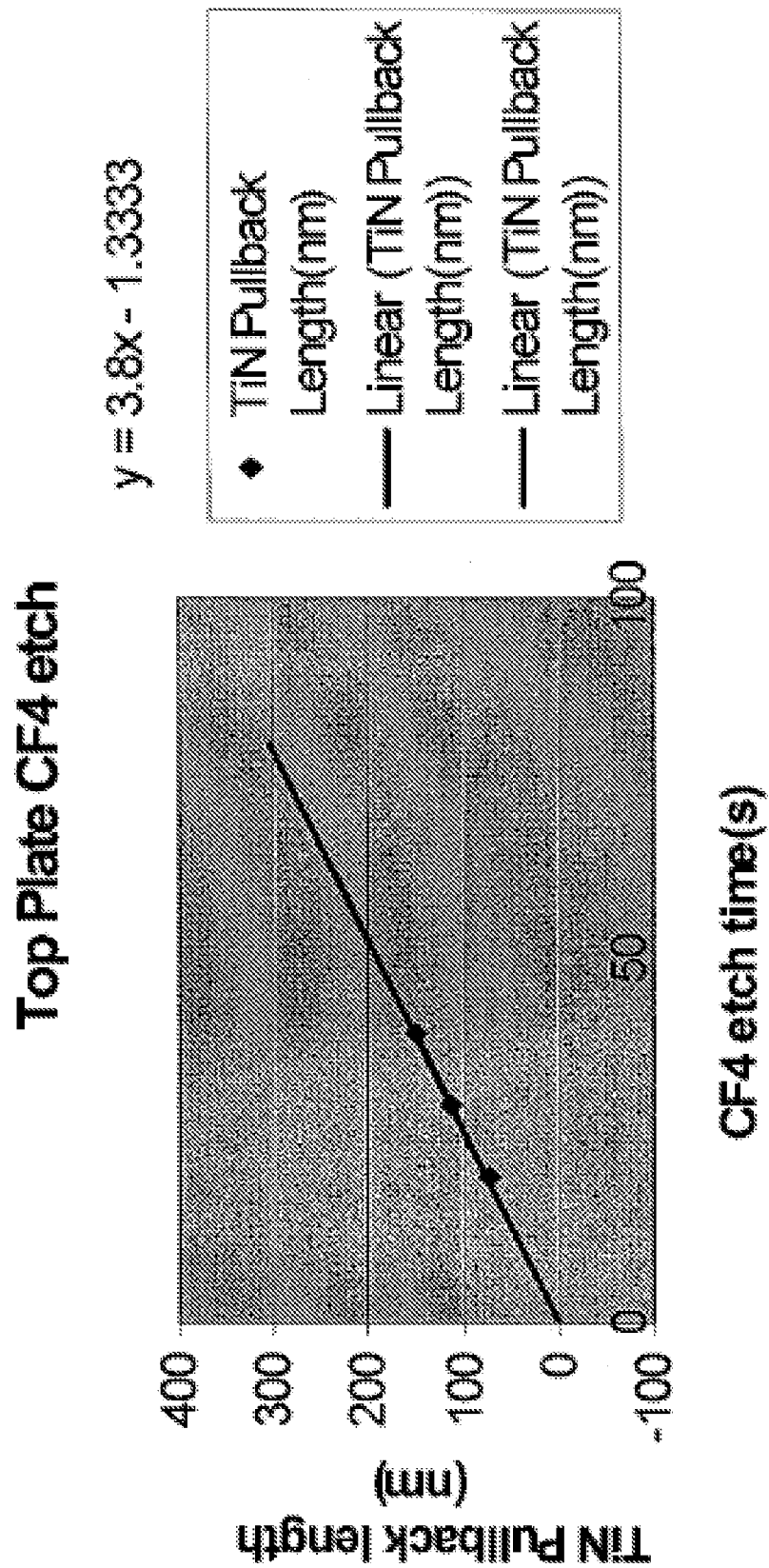
FIG. 13 illustrates the linear relationship between pull back and exposure time.

A resist 201 is placed on hardmask 200, as shown in FIG. 7. Resist 201 is configured to define the dimensions of bottom plate 105 for the completed MIM capacitor 100'. Portions of hardmask 200, as well as portions of top layer 201 outside of resist 201/hardmask 200 are removed, e.g., via etching, e.g., reactive ion etching (RIE), down to first dielectric layer 102, as shown in FIG. 8. Resist layer 201 is then removed, e.g., via conventional plasma stripping. As shown in FIG. 9, portions of first layer 101 below hardmask 200 are pulled back via plasma etching, e.g., CF4 plasma pull back. Moreover, the pull back can be in a range of 300-800 nm, and preferably 500 nm. FIGS. 12 and 13 are provided to show, by way of example, the use of CF4 plasma when the conductor is TiN. Of course, when other conductors are utilized instead of TiN, other more suitable plasmas may be utilized without departing from the spirit of the invention. Moreover, suitable plasmas for specific conductors can be determined by analyzing the relevant chemistries. FIG. 12 shows a scanning electron microscope image of CF4 plasma pull back of 40 s in TiN, in which the layer beneath the dielectric is pulled back 150 nm. It is noted that plasma pressure and power can be varied to reduce etch time. FIG. 13 graphically illustrates the linear relationship of CF4 etch time versus TiN pull back length. As shown in FIG. 13, the x-axis represents CF4 etch time(s) and the y-axis represents TiN pull back length in nm. At 20 s etch time, the pull back length is about 76 nm, at 30 s etch time, the pull back is about 112 nm, and at 40 s etch time, the pull back length is about 150 nm. Thus, the TiN pull back length over time is a linear function defined by the equation $y=3.8x-1.3333$.

Figure 10:
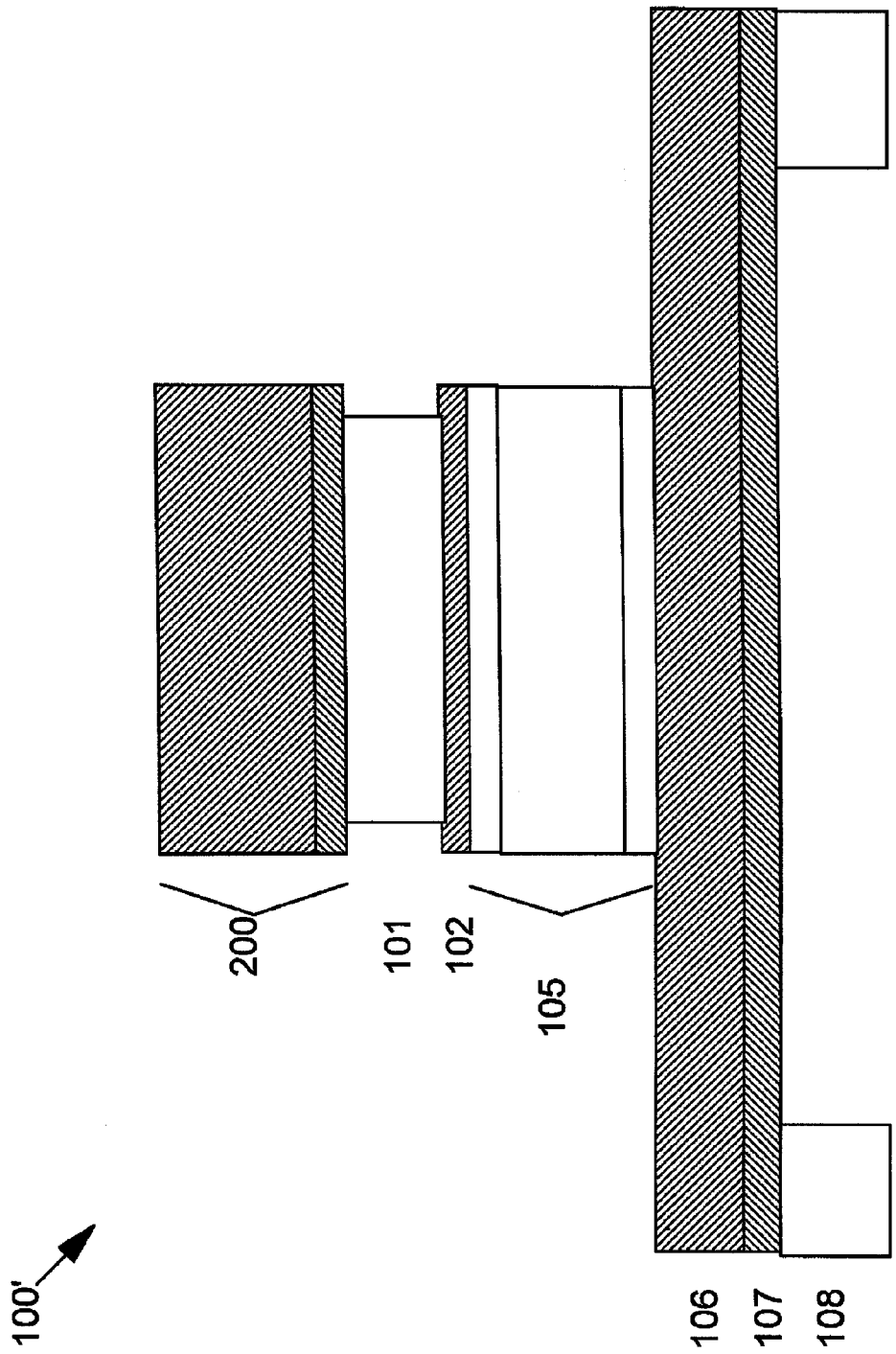
Figure 11:
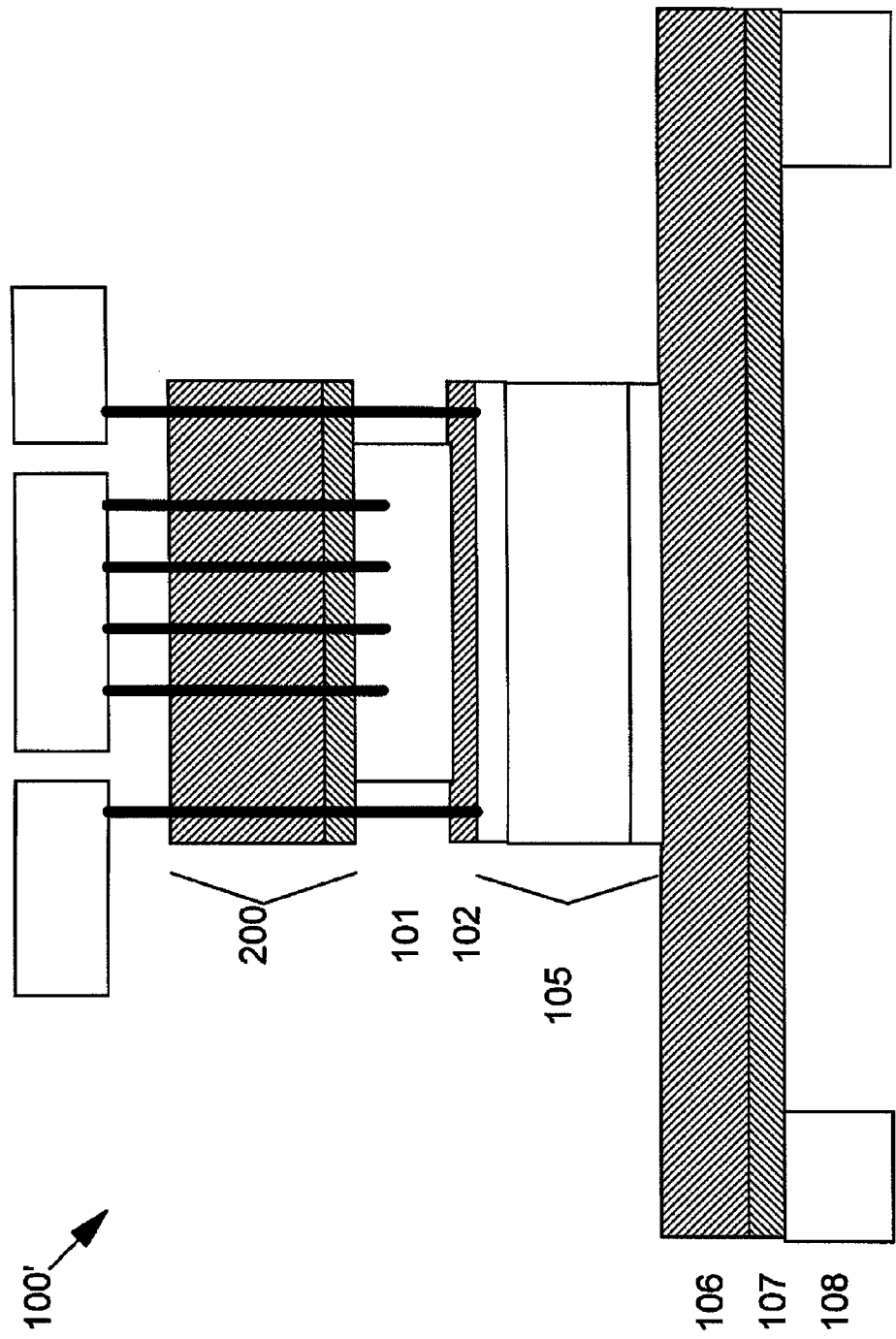

The process for forming capacitor 100' continues in FIG. 10 in which bottom 105 is etched to match the dimensions of hardmask 200 down to etch stop layer 106. Subsequently, as illustrated in FIG. 11, the single MIM parallel wiring is coupled from capacitor 100 to conductors through vias, e.g., copper. It is noted that hardmask 200 is not removed from the device, since, as the device will be embedded in $SiO_2$, the hardmask will become part of the embedding oxide. It is further noted that the dimensions of the top electrode determines device characteristics.

Thus, the present invention can be used to form a single layer MIM capacitor while utilizing only a single mask.

Moreover, an advantage of the instant invention is that the number of MIM levels is independent of the number of mask levels. That is, dimensions of a bottom plate can be defined by a mask, e.g., a hardmask, exposing the portions of the first plate to be pulled back. As all plates will be pulled back during plasma etching, it is preferred to expose only the plate to be pulled back. Further, as some of the hardmask will be etched at every level, the hardmask thickness should be sufficient to survive the number of levels to be etched, where n (i.e., 1, 2, 3, 4 . . . ) is the number of MIM levels to be integrated. A series of plasma etches (pullback) and metal reactive ion etching (RIE) is used to complete the MIM integration.

Figure 14:
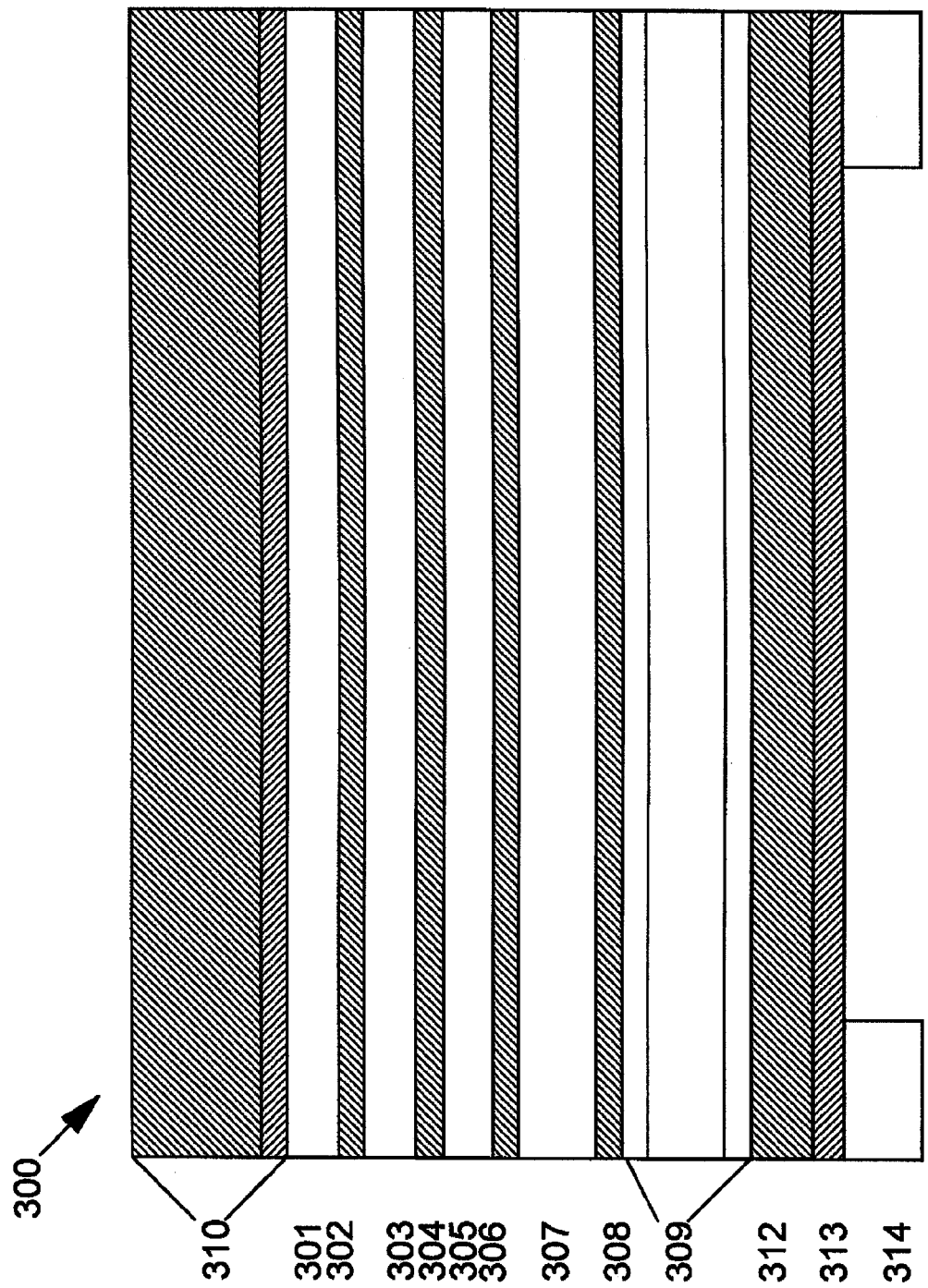
FIGS. 14-24 illustrate a multiple level MIM integration in accordance with the features of the present invention.

In another exemplary embodiment of the instant invention, multiple level MIM integration is shown in FIGS. 14-24. The process for forming capacitor 300 begins with the formation of the chip through blanket film deposition, as shown in FIG. 14. As shown in FIG. 14, the chip includes four conductive layers 301, 303, 305, and 307, e.g., TiN, TaN, tungsten, aluminum, or any other suitable conductor, above conductive bottom plate 309, which may be a single conductor or a sandwiched conductor formed of more than one metal, e.g., TiN/W/TiN, Ta/TaN, or any suitable conductor, in which each layer is separated by a dielectric layer 302, 304, 306, and 308 e.g., $SiO_2$, SiN, Hi-K materials, aluminum oxide, tantalum oxide, hafnium oxide, zirconium oxide, or other suitable dielectric. A hard mask 310, which may be a single insulator or a sandwiched insulator composed of more than one element e.g., $SiO_2$/SiN or other suitable insulator, is positioned over top layer 301. Further, bottom plate 309 can be formed on an insulating layer 312, e.g., $SiO_2$ or other suitable insulator, acting as an etch stop layer, which is formed on insulating layer 313, e.g., silicon nitride or other suitable insulator acting as diffusion barrier, that is connected to conductors 314, e.g., copper or other suitable conductor.

Figure 15:
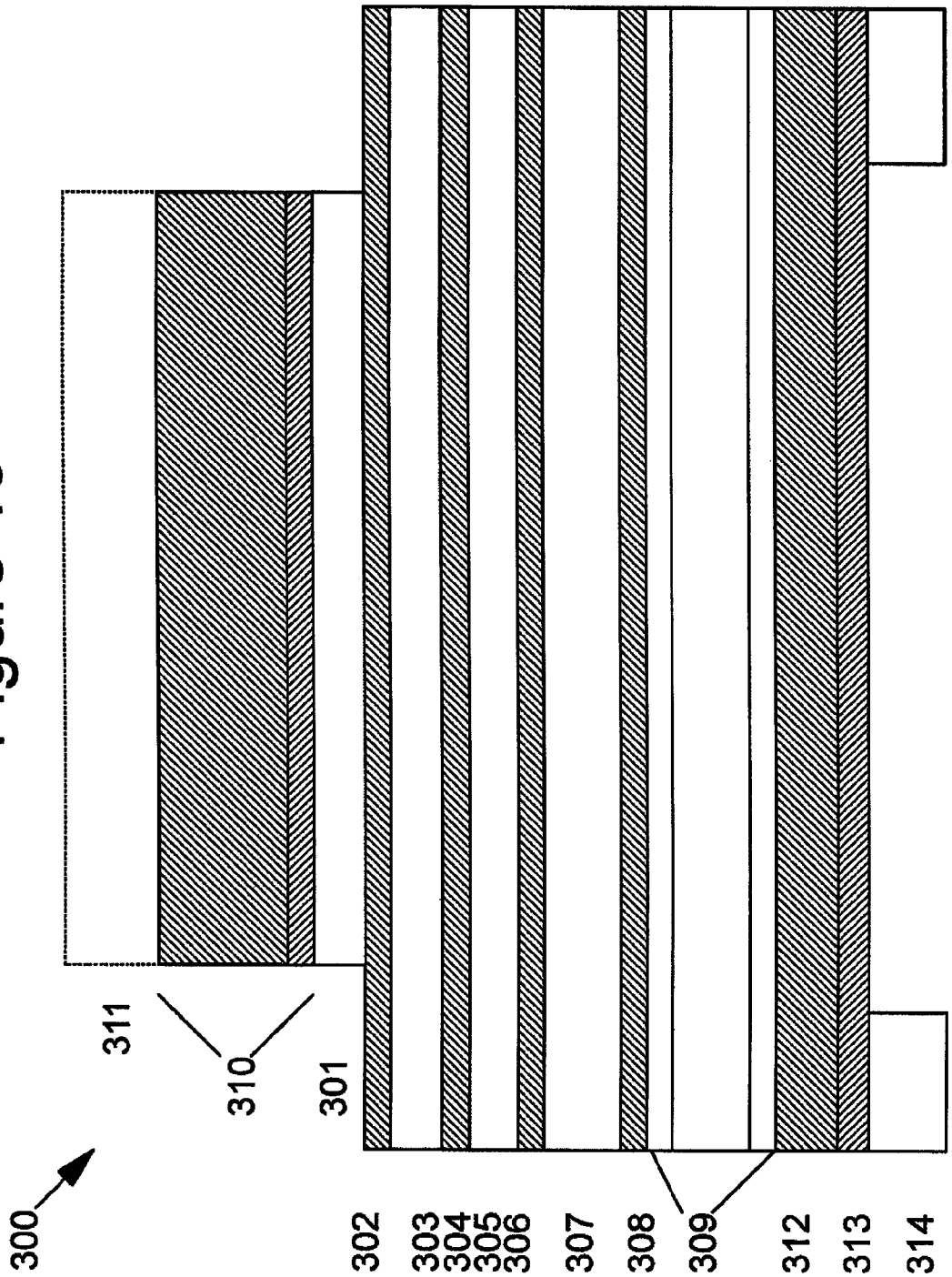
Figure 16:
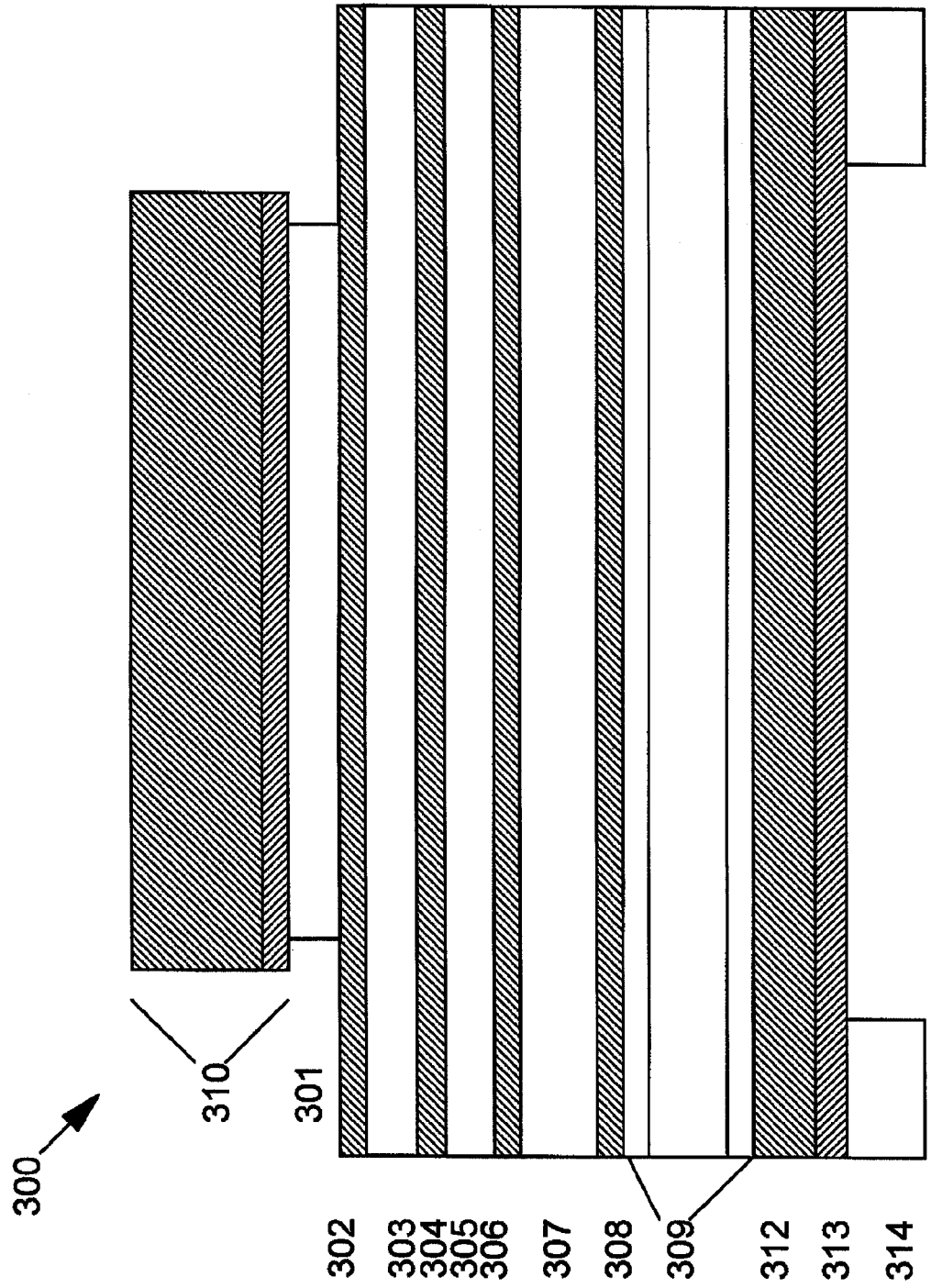

A resist 311 is placed on hardmask 310 that is positioned over conductive top layer 301, as shown in FIG. 15, to define hardmask 310 and the dimensions of bottom plate 309 for the completed MIM capacitor 300. Once in place, portions of hardmask 310 and conductor 301 outside of resist 311 are removed, e.g., via etching, such as RIE, down to first dielectric layer 302. Moreover, after defining hardmask 310, resist 311 can be removed by any conventional process, such as plasma stripping. As shown in FIG. 16, portions of first layer 301 below hardmask 310 are pulled back via plasma etching, e.g., CF4 plasma pull back, as discussed above.

Figure 17:
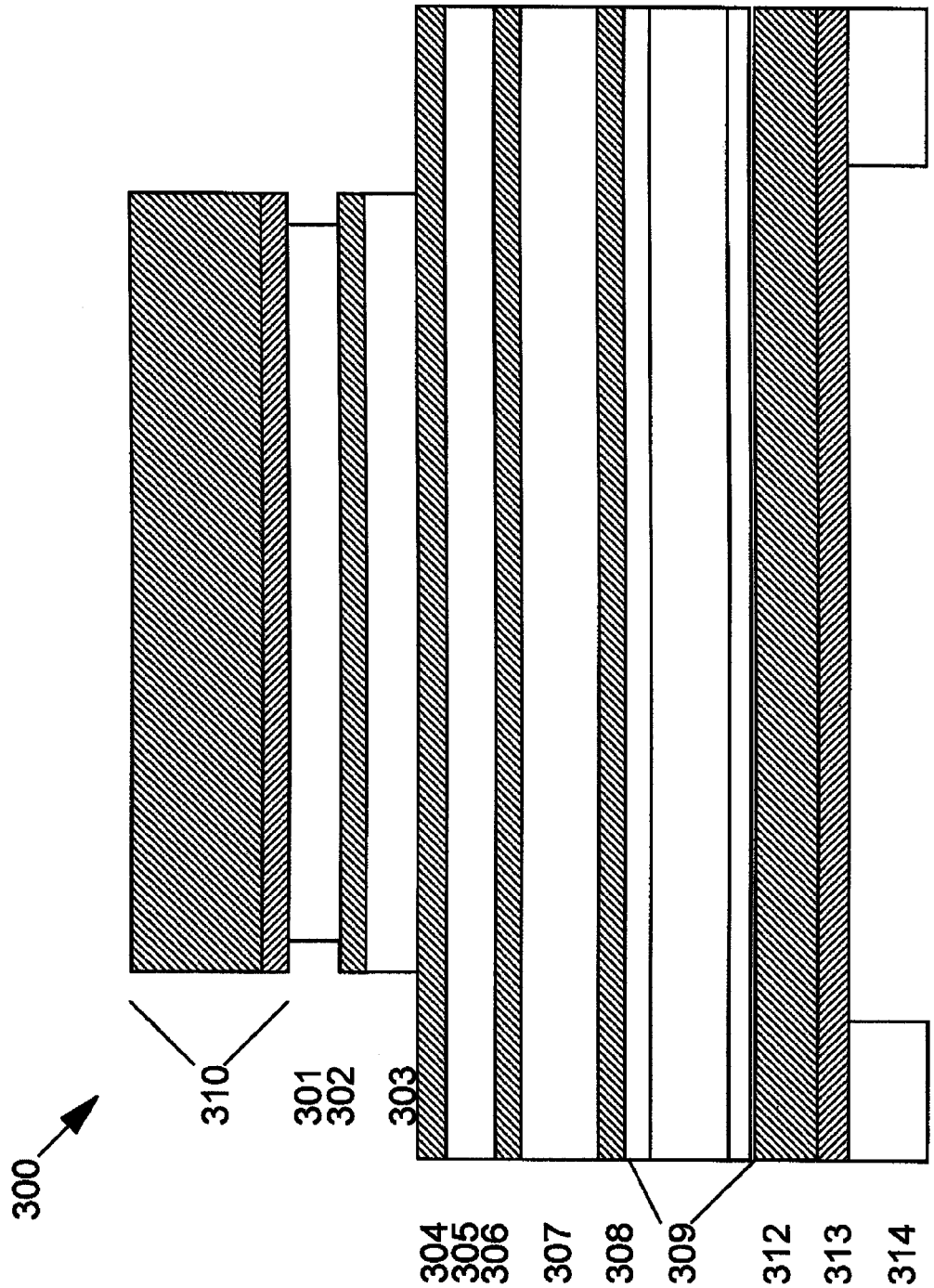
Figure 18:
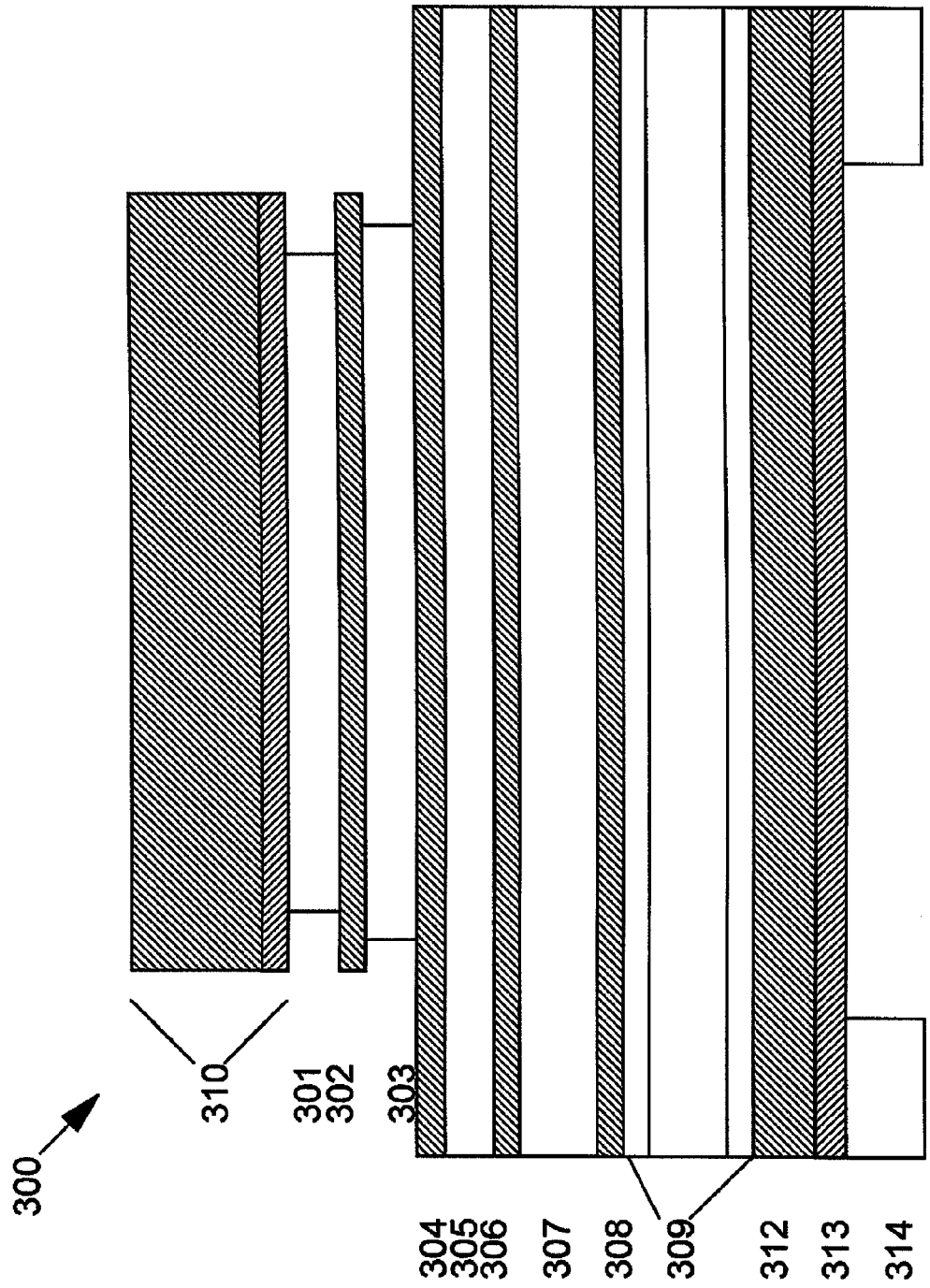

As shown in FIG. 17, a second etching is performed in which portions of dielectric 302 and second plate 303 outside of hardmask 310 are removed down to second dielectric layer 304. As all conductor plates will be pulled back during plasma etching, conductor plates are exposed one at a time. In this regard, as shown in FIG. 18, portions of first layer 301 and second layer 303 below their respective dielectric layers 310 and 302 are pulled back via CF4 pull back. In this regard, it is noted that both exposed layers 301 and 303 are pulled back according to the linear relationship discussed above. Moreover, as hardmask 310 will be degraded during each successive etching procedure, hardmask 310 should be selected to have a thickness sufficient to complete the number of levels to be etched, e.g., greater than 1000 Å.

Figure 19:
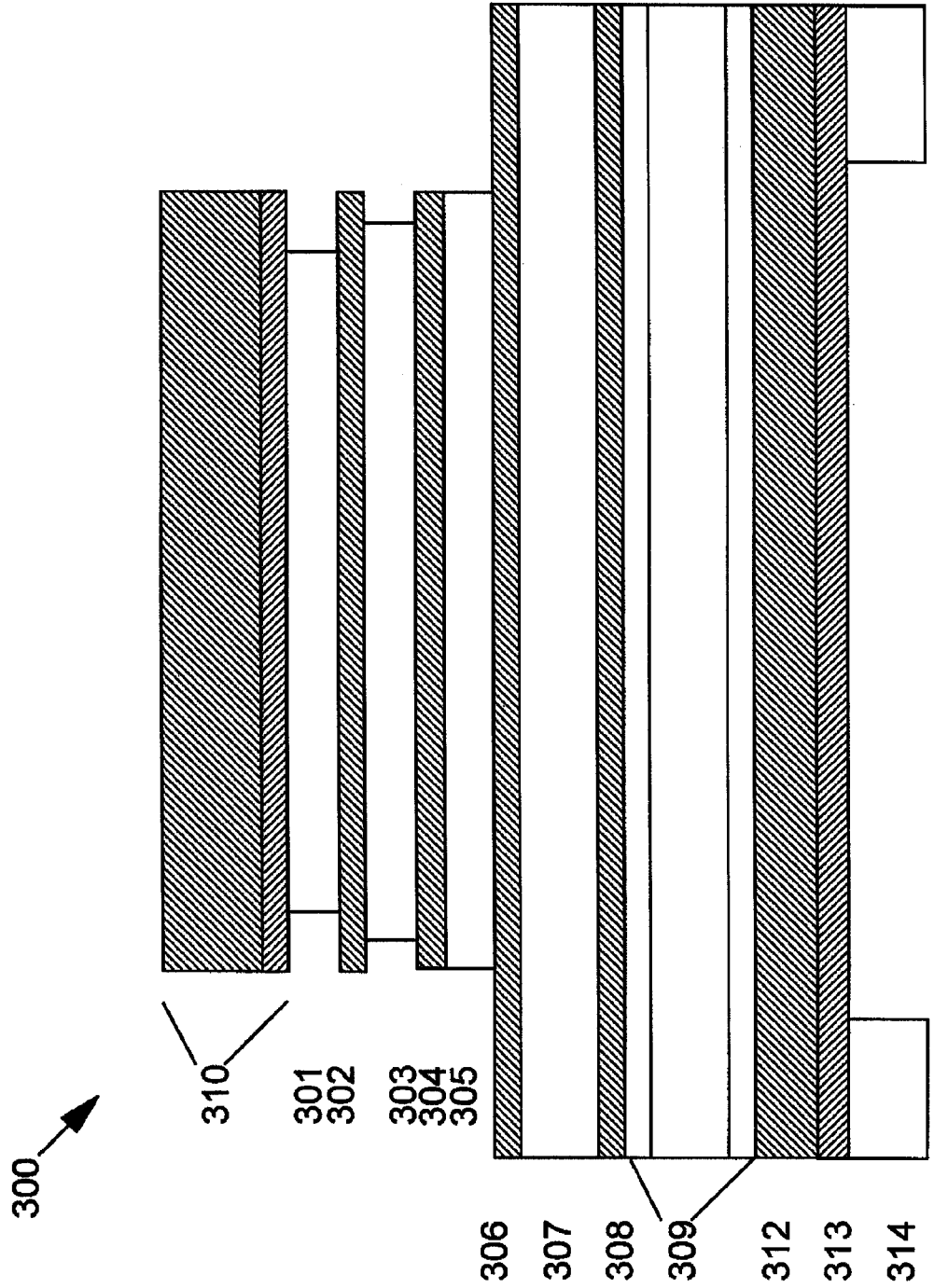
Figure 20:
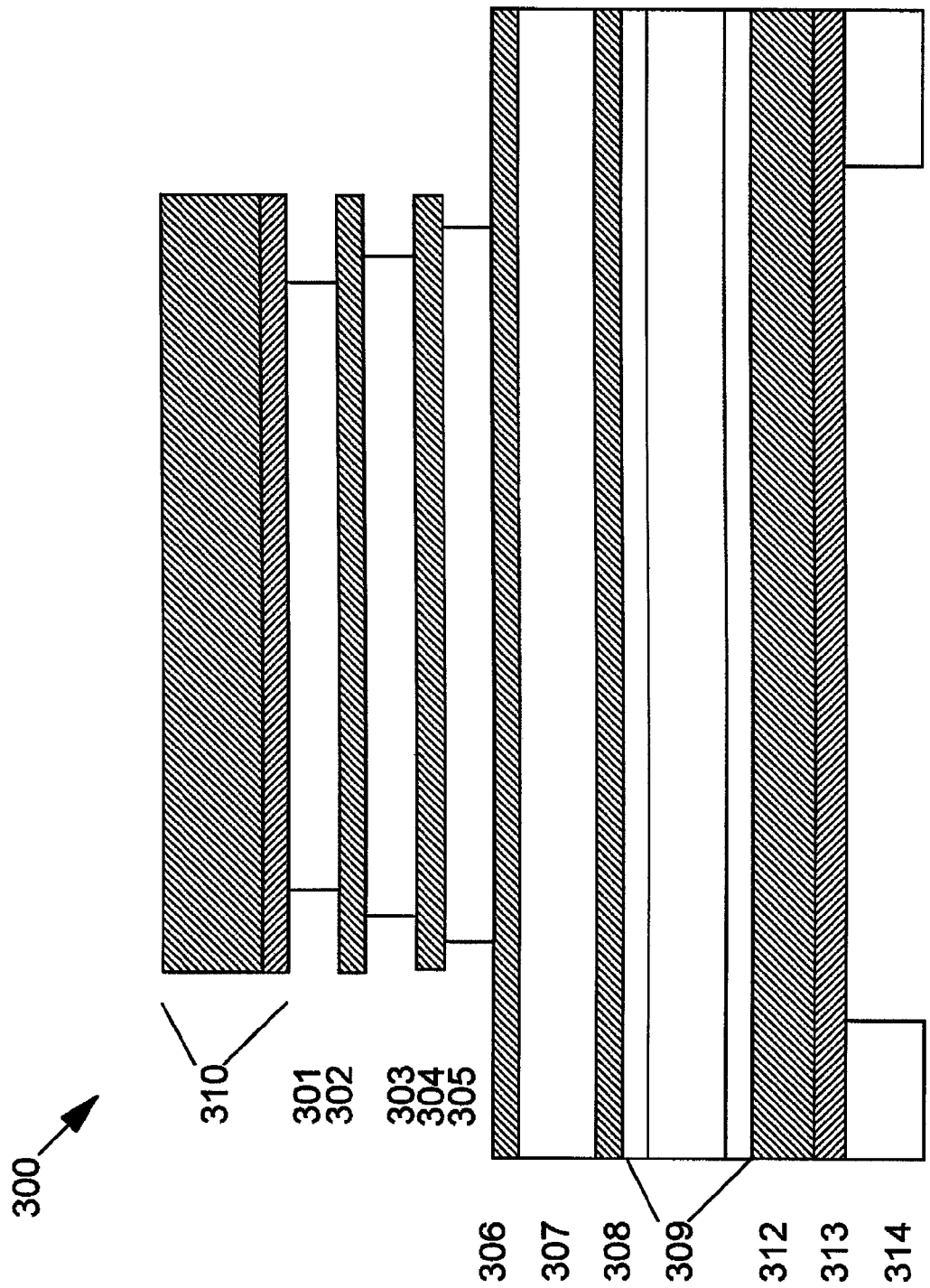

In FIG. 19, a third etching is performed in which portions of dielectric 304 and third plate 305 outside of hardmask 310 are removed down to dielectric layer 306. Next, portions of first layer 301, second layer 303, and third layer 305 below their respective dielectric layers 310, 302, and 304 are pulled back, as shown in FIG. 20.

Figure 21:
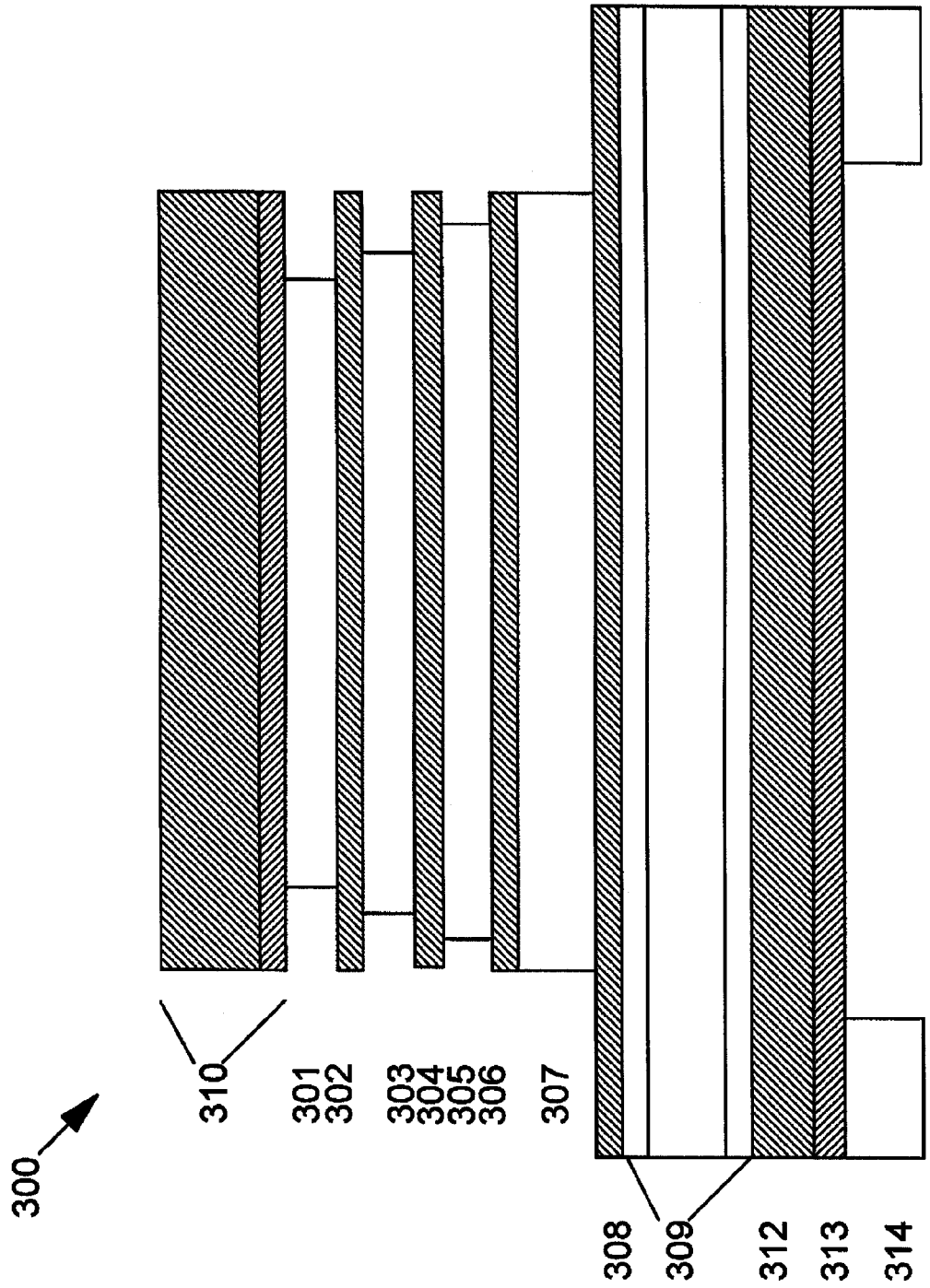
Figure 22:
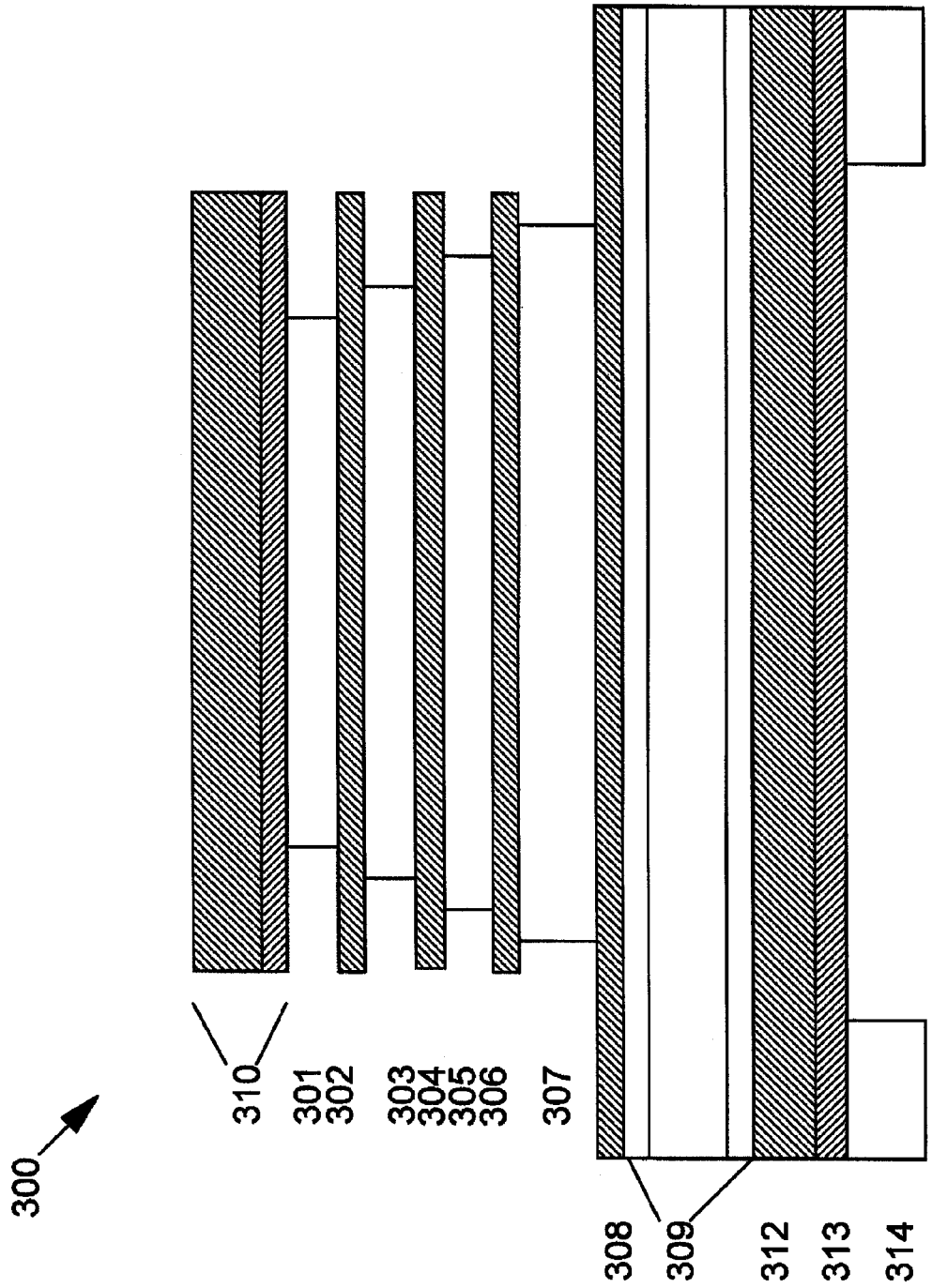

A fourth etching is shown in FIG. 21, in which exposed portions of dielectric 306 and fourth plate 307 outside of hardmask 310 are removed down to dielectric layer 4. Again, portions of first layer 301, second layer 303, third layer 305, as well as fourth layer 307, below their respective dielectric layers 310, 302, 304, and 306 are pulled back, as shown in FIG. 22.

Figure 23:
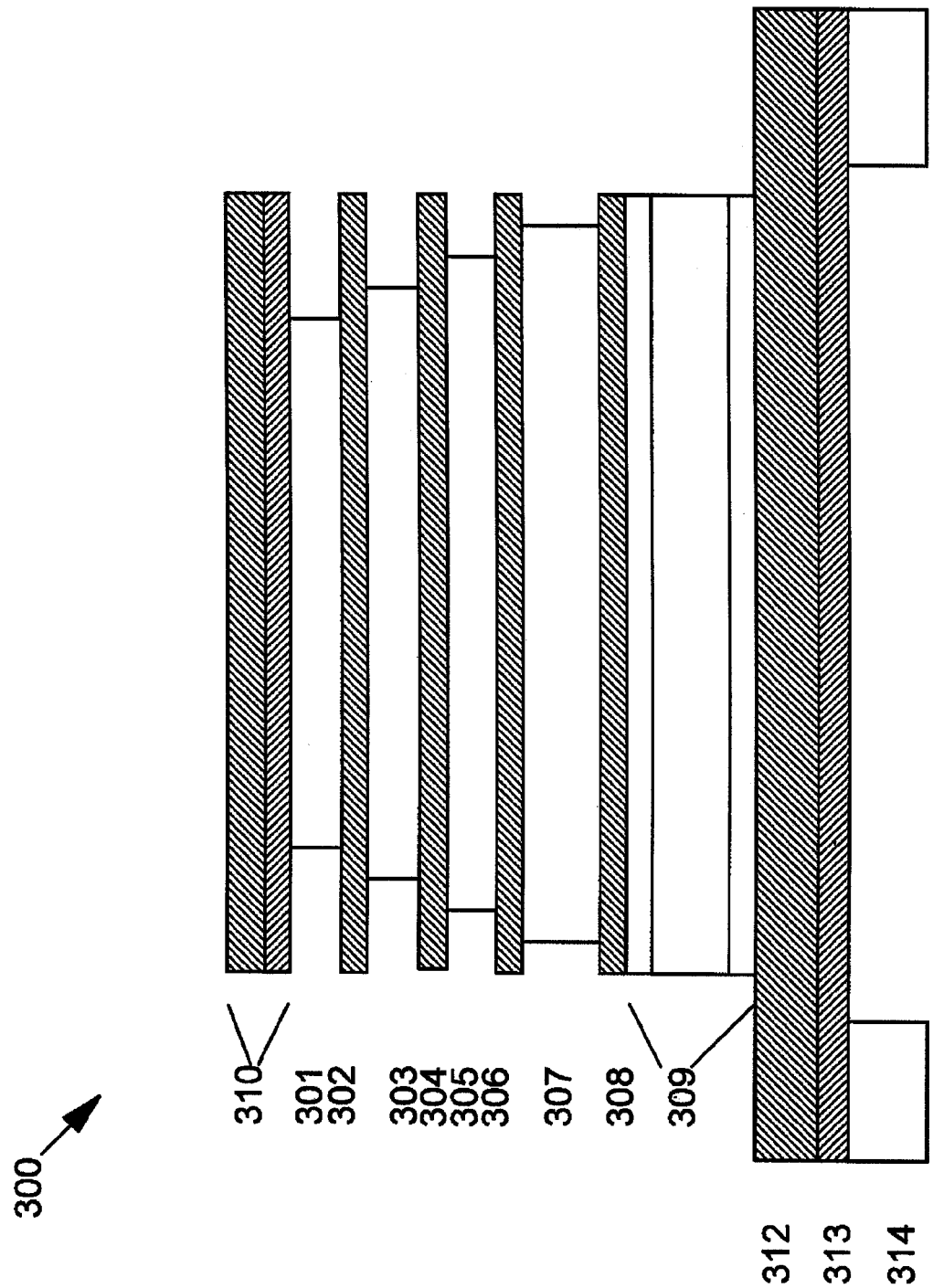
Figure 24:
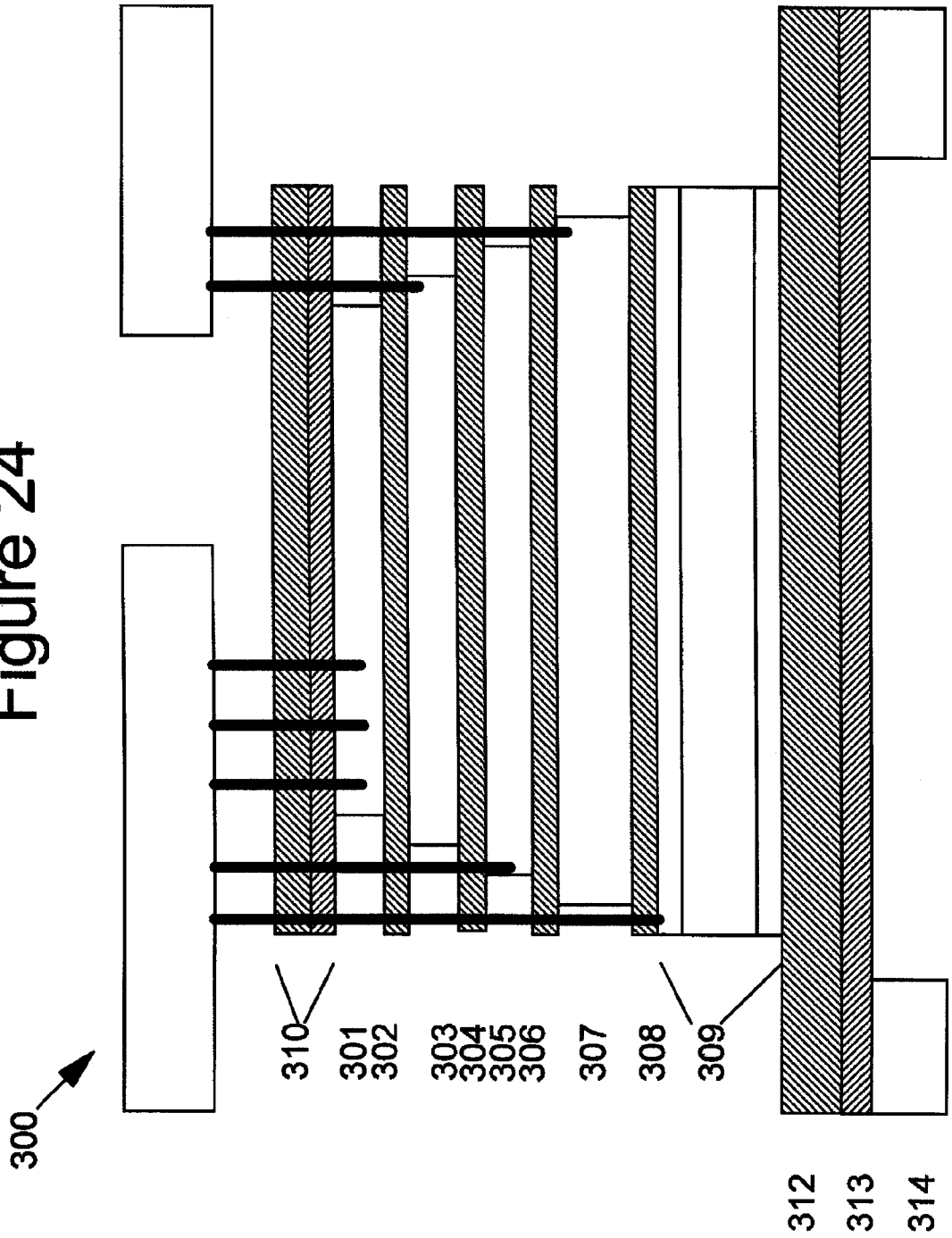

In FIG. 23, exposed portions of dielectric 308 and bottom plate 309 are removed down to etch stop layer, such that the dimensions of bottom plate 309 correspond to the dimensions of mask 310. Thus, the instant invention provides a multiple layer MIM integration while requiring only a single mask. Subsequently, as illustrated in FIG. 24, the multiple level MIM parallel wiring is coupled from capacitor 300 to conductors, e.g., copper, through vias, e.g., copper.

While the above exemplary embodiments have been described with a hardmask, it is noted that, in accordance with the present invention, the masking layer can be a soft mask (i.e., photoresist) or a hard mask (i.e., silicon nitride) without departing from the scope and spirit of the invention.

In particular, while the above exemplary embodiments have been directed to plasma etching, it may be advantageous to utilize wet etching, as discussed below.

According to another feature of the invention, the resist layer can be removed, e.g., via plasma stripping, prior to the step of removing, i.e., pulling back, portions of the upper metal layer. In this embodiment, illustrated in FIG. 25, a resist layer 400 can be placed on conductive top layer 401, e.g., platinum or other suitable conductor for wet etching, separated from conductive bottom plate 403, which can be a single conductor or a sandwiched conductor composed of more than one metal, e.g., TiN/W/TiN, Ta/TaN, by a dielectric layer 402, e.g., $Ta_2O_5$. Resist layer 400 defines the dimensions of bottom plate 403, such that exposed portions of the top and bottom layers are removed in a single etching procedure. Next, a resist strip removes resist layer 400, and a subsequent wet etch process, which will effect only the platinum layer, pulls back portions of top layer 401. However, because the top surface of the top conductor 401 is exposed to the wet etch, a certain degradation in thickness occurs.

In a further exemplary embodiment, the resist can remain during the step of pulling back portions of the upper metal layer. In this regard, FIG. 26 illustrates a resist layer 500 placed on top layer 501, e.g., platinum, separated from bottom plate 503, e.g., TiN/W/TiN, by a dielectric layer 502, e.g., $Ta_2O_5$. Resist layer 500 defines the dimensions of bottom plate 503, such that exposed portions of the top and bottom layers are removed. Next, a wet etch process pulls back portions of top layer 501 only, and then a resist strip removes resist layer 500. In contrast to the process shown in FIG. 25, because the resist protects the top surface of top conductor 501, the wet etching does not degrade the thickness of conductive layer.

A further exemplary process for performing the RIE and pull back is illustrated in FIG. 27. In particular, a resist layer 600 can be placed on a dielectric layer 601 covering top layer 602, e.g., platinum. Top layer 602 can be separated from bottom plate 604, e.g., TiN/W/TiN, by a dielectric layer 603, e.g., $Ta_2O_5$. Resist layer 600 defines the dimensions of bottom plate 604, such that exposed portions of the top and bottom layers are removed at the same time. Next, a resist strip removes resist layer 400 from dielectric layer 401, and a subsequent wet etch process pulls back portions of top layer 602 below dielectric layer 601. In this embodiment, the dielectric layer acts to protect the upper surface of top conductor 602 so that the wet etching does not adversely affect the thickness of the conductor.

Advantageously, the instant invention provides an almost unlimited number of MIM levels without adding mask costs, and enables super high capacitance capabilities, which is required when the limit of HiK is reached. In this regard, the present invention produces an MIM with less reliability degradation for multiple levels to increase capacitance density than thinning down the film, as in conventional processes.

While the invention has been described in terms of exemplary embodiments, those skilled in the art will recognize that the invention can be practiced with modifications and in the spirit and scope of the appended claims.

What is claimed:

1. A method of fabricating a MIM capacitor, comprising:
providing a substrate including a dielectric layer formed on a first conductive layer and a second conductive layer formed over the dielectric layer;
patterning a mask on the second conductive layer;
removing exposed portions of the second conductive layer to form an upper plate of a MIM capacitor having edges substantially aligned with respective edges of the mask;
undercutting the upper plate so that edges of the upper plate are located under the mask; and
removing exposed portions of the dielectric layer and the first conductive layer using the mask to form a capacitor dielectric layer and a lower plate of the MIM capacitor having edges substantially aligned with respective edges of the mask.

2. The method in accordance with claim 1, wherein the removing comprises reactive ion etching and the undercutting comprises plasma etching.

3. The method in accordance with claim 1, wherein the mask comprises a hardmask.

4. The method in accordance with claim 1, wherein the removing comprises reactive ion etching and the undercutting comprises wet etching.

5. The method in accordance with claim 1, wherein the mask comprises a resist layer.

6. The method in accordance with claim 1, wherein the method is a single MIM integration utilizing only one mask.

7. A method of fabricating an MIM capacitor from a substrate having a first conductive layer and a second conductive layer separated by a first dielectric layer, the method comprising:
placing a mask on the first conductive layer;
removing exposed portions of the first conductive layer outside of the mask, such that a periphery of the first conductive layer essentially aligns with a periphery of the mask;
pulling back the periphery of the first conductive layer, such that the periphery of the first conductive layer is located under the mask; and
removing exposed portions of the first dielectric layer and the second conductive layer outside of the mask, such that a periphery of the first dielectric layer and the second conductive layer essentially align with the periphery of the mask.

8. The method in accordance with claim 7, further comprising simultaneously pulling back the peripheries of the first dielectric layer and the second conductive layer, such that these peripheries are located under the mask and the periphery of the first conductive layer, such that the peripheries of the first dielectric layer and the second conductive layer are outside of the periphery of the first conductive layer.

9. The method in accordance with claim 8, wherein the substrate further includes a third conductive layer arranged below the second layer and a second dielectric layer positioned between the third conductive layer and the second conductive layer, and the method further comprises removing exposed portions of the second dielectric layer and the third conductive layer outside of the mask, such that a periphery of the second dielectric layer and the third conductive layer essentially align with the periphery of the mask.

10. The method in accordance with claim 8, wherein the substrate further includes additional conductive layers arranged below the second layer and additional dielectric layers separating the additional conductive layers, and the method further comprises:
   simultaneously pulling back the peripheries of the conductive and dielectric layers that have had exposed portions outside of the mask removed;
   removing exposed portions of a next dielectric layer and a next conductive layer outside of the mask; and
   repeating the simultaneous pulling back of the peripheries of the conductive and dielectric layers and the removing of exposed portions of the next dielectric layer and the next conductive layer until an etch stop layer reached.

11. The method in accordance with claim 7, wherein the removing comprises reactive ion etching and the undercutting comprises plasma etching.

12. The method in accordance with claim 7, wherein the mask comprises a hardmask.

13. The method in accordance with claim 7, wherein the removing comprises reactive ion etching and the undercutting comprises wet etching.

14. The method in accordance with claim 7, wherein the mask comprises a resist layer.

15. The method in accordance with claim 7, wherein the method is a single MIM integration utilizing only one mask.

16. The method in accordance with claim 7, wherein the method is a dual MIM integration utilizing only one mask.

17. The method in accordance with claim 7, wherein the method is a multi-level MIM integration utilizing only one mask.

18. A method of fabricating a MIM capacitor comprising:
   forming a first conductive layer on a substrate;
   forming a dielectric layer on the first conductive layer, the edges of the dielectric layer being formed to substantially align with respective edges of the first conductive layer;
   forming a second conductive layer directly on the dielectric layer, the second conductive layer having a width dimension that is smaller than the first conductive layer and the dielectric layer; and
   forming a hard mask having a planar upper surface and a planer lower surface directly on the second conductive layer, the edges of the hard mask being formed to align with respective edges of the dielectric layer, such that the first conductive layer, the dielectric layer and the hard mask have substantially equal dimensions.

19. The method of claim 18, further comprising:
   forming one or more first interconnect vias passing through the hard mask and contacting the second conductive layer, and
   forming one or more second interconnect vias passing through the hard mask, contacting the first conductive layer, and bypassing the second conductive layer such that the second interconnect vias are disposed in a region between the edges of the conductive layer and the edges of the hard mask.

\* \* \* \* \*